United States Patent
Kaneko

(10) Patent No.: US 8,426,089 B2
(45) Date of Patent: Apr. 23, 2013

(54) COLORED CURABLE COMPOSITION, COLOR FILTER, AND METHOD FOR PRODUCING COLOR FILTER

(75) Inventor: Yushi Kaneko, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 271 days.

(21) Appl. No.: 12/933,309

(22) PCT Filed: Mar. 11, 2009

(86) PCT No.: PCT/JP2009/054601
§ 371 (c)(1),
(2), (4) Date: Sep. 17, 2010

(87) PCT Pub. No.: WO2009/116434
PCT Pub. Date: Sep. 24, 2009

(65) Prior Publication Data
US 2011/0014554 A1    Jan. 20, 2011

(30) Foreign Application Priority Data
Mar. 17, 2008  (JP) ................................. 2008-068190

(51) Int. Cl.
*G02B 5/20* (2006.01)
(52) U.S. Cl.
USPC .......................................... 430/7; 430/281.1
(58) Field of Classification Search .................. None
See application file for complete search history.

(56) References Cited

U.S. PATENT DOCUMENTS
5,700,395 A    12/1997    Thetford et al.

FOREIGN PATENT DOCUMENTS

| CN | 1742058 A | 3/2006 |
|---|---|---|
| JP | 07-207012 A | 8/1995 |
| JP | 08-010601 A | 1/1996 |
| JP | 8-507960 A | 8/1996 |
| JP | 09-176511 A | 7/1997 |
| JP | 2001-214077 A | 8/2001 |
| JP | 2001-272524 A | 10/2001 |
| JP | 2004-067715 A | 3/2004 |
| JP | 2006-030541 A | 2/2006 |
| JP | 2007-063472 A * | 3/2007 |

OTHER PUBLICATIONS

Computer-generated translation of JP 2007-063472 (Mar. 2007).*
First Office Action, dated Nov. 16, 2011, issued in corresponding CN Application No. 200980108917.0, 12 pages in English and Chinese.
Extended European Search Report dated Sep. 21, 2012 on EP Application No. 09 72 3094.

* cited by examiner

*Primary Examiner* — John A. McPherson
(74) *Attorney, Agent, or Firm* — Sughrue Mion, PLLC

(57) ABSTRACT

A colored curable composition including: a resin obtained by reacting a polymer of an alkylene imine having 2 to 4 carbon atoms, a number average molecular weight of the polymer being 300 to 1,500, with a polyester having a carboxyl group at least one terminal, a number average molecular weight of the polyester being 1,000 to 1,000,000; a pigment; a photopolymerization initiator; a compound containing an ethylenically unsaturated double bond; and a solvent.

9 Claims, No Drawings

COLORED CURABLE COMPOSITION, COLOR FILTER, AND METHOD FOR PRODUCING COLOR FILTER

CROSS REFERENCE TO RELATED APPLICATIONS

This application is a National Stage of International Application No. PCT/JP2009/054601 filed Mar. 11, 2009, claiming priority based on Japanese Patent Application No. 2008-068190 filed Mar. 17, 2008, the contents of all of which are incorporated herein by reference in their entirety.

TECHNICAL FIELD

The present invention relates to a colored curable composition suitable for manufacturing a color filter to be used for, for example, a liquid crystal display device (LCD), or a solid-state imaging device (for example, CCD or CMOS), a color filter with colored area formed by the colored curable composition, and a method for producing the color filter.

BACKGROUND ART

A color filter is an essential component in a liquid crystal display or solid-state imaging device. The color filter is usually manufactured by a photolithography method using a curable composition containing colorants (pigments or dyes). In the case in which the colorants are pigments, it is necessary to use dispersants in order to secure the dispersibility and dispersion stability of the pigments. In particular, a polymer dispersant has been developed as a dispersant having excellent dispersibility and dispersion stability. For example, it is disclosed that a resin having polyalkylene imine as the main chain has a dispersion function in Japanese Patent Application Laid-Open (JP-A) No. 7-207012, Japanese National Phase Publication (JP-A) No. 8-507960, JP-A No. 8-10601 and JP-A No. 2001-272524, but the resin is used in paints or printing inks, in which pattern formation by a photolithography method which is required for a color filter is not taken into consideration.

In recent years, higher image quality and increases in contrast and color purity have been demanded in liquid crystal displays in comparison with existing ones for TV use and monitor use. With respect to a curable composition for producing a color filter, attempts have been made to increase contrast by using a pigment having a finer particle size (see, for example, JP-A No. 2001-272524).

Furthermore, also in color filters for solid-state imaging devices, a reduction in color unevenness has been required in order to increase resolution. Therefore, it is important to disperse fine pigments having a fine particle size without secondary aggregates.

However, when the particle size of a pigment is made finer, the specific surface area of the pigment becomes large, the stability of dispersion state is deteriorated, and it is difficult to satisfy both contrast or color unevenness and dispersion stability. In order to increase dispersion stability, when a great amount of dispersants is used, there occur problems that, for example, a pattern formation using a photolithography method cannot be performed, curability is insufficient or adhesion property to a substrate is deteriorated.

In order to solve these problems, various dispersants have been suggested, but none are yet sufficient. For example, dispersants such as cationic, anionic, amphoteric or nonionic dispersants with a urethane bond are disclosed in JP-A No. 2006-30541, and it is disclosed in JP-A No. 9-176511 that a dispersant containing an acidic derivative of organic pigment and a cationic comb-shaped graft polymer having a cationic functional group in a main polymer portion is used in a color resist for forming a color filter.

In recent years, there has been particular demand for increases in color purity in color filters for liquid crystal display devices. Thus, the amount of pigments to be filled is required to be increased. Color filters for solid-state imaging devices have also been required to reduce stray light due to scattering for increasing resolution, and thus there is a strong desire to obtain a thin colored layer. Accordingly, also in manufacturing a color filter for the solid-state imaging device, the amount of pigments to be filled is required to be increased. In order to increase the amount of pigments to be filled, it is necessary to increase the pigment concentration in a curable composition. However, when the pigment concentration is increased, there occur problems in that the content of dispersion resins and curable components (for example, monomers, and polymerization initiators) in a curable composition are necessarily reduced, thus reducing the storage stability and adhesion property to a substrate, and pattern formability becomes poor.

DISCLOSURE OF INVENTION

Problems to be Solved by the Invention

An object of the invention is to provide a colored curable composition which has good color characteristics such as contrast and color unevenness, and is excellent in dispersion stability and adhesion property to a substrate.

A further object of the invention is to provide a color filter having colored pattern formed by the colored curable composition and a method for producing the color filter.

Means for Solving the Problems

As a result of extensive research in view of the above circumstances, the present inventors have found that a resin having a specific structure of the invention, a pigment dispersion liquid containing the resin, and a colored curable composition provide unexpectedly increased dispersibility and dispersion stability. Furthermore, the invention has been accomplished by using a color filter which is manufactured by a colored curable composition containing the resin of the invention.

In other words, an object of the invention is attained by the following means.

<1> A colored curable composition comprising:
(A) a resin obtained by reacting (A-1) a polymer of an alkylene imine having 2 to 4 carbon atoms, a number average molecular weight of the polymer being 300 to 1,500, with (A-2) a polyester having a carboxyl group at least one terminal, a number average molecular weight of the polyester being 1,000 to 1,000,000;
(B) a pigment;
(C) a photopolymerization initiator;
(D) a compound containing an ethylenically unsaturated double bond; and
(E) a solvent.
<2> The colored curable composition according to <1>, further comprising (F) an alkali-soluble resin.
<3> The colored curable composition according to <1> or <2>, wherein an average primary particle diameter of the pigment is 50 nm or less.
<4> A color filter comprising a colored pattern formed by the colored curable composition according to any one of <1> to <3> on a support, wherein the color filter is used in color separation in a solid-state imaging device.

<5> A method for producing a color filter, comprising:
coating the colored curable composition according to any one of <1> to <3> on a support to form a colored layer; pattern exposing the colored layer through a mask; and developing the colored layer after exposure to form a colored pattern.

Effects of Invention

According to the invention, there can be provided a colored curable composition which has good color characteristics such as contrast and color unevenness by dispersing a pigment using a resin having a specific structure, and furthermore is excellent in dispersion stability and adhesion property to a substrate.

Furthermore, a color filter having a colored pattern formed from the colored curable composition and a method for producing the color filter can be provided.

BEST MODE FOR CARRYING OUT THE INVENTION

Description is made below in detail with respect to the best mode of implementing the invention. Furthermore, colored areas in the invention include a colored pixel (colored pattern) area and a light shielding film forming area in a color filter. Incidentally, in the present specification, when groups (atomic groups) are denoted without specifying whether substituted or unsubstituted, the groups include both a group having no substituent and a group having a substituent. For example, an "alkyl group" includes not only an alkyl group having no substituent (unsubstituted alkyl group) but also an alkyl group having a substituent (substituted alkyl group).

A colored curable composition of the invention contains (A) a resin (hereinafter, also referred to as (A) specific resin) obtained by reacting (A-1) a polymer of an alkylene imine having 2 to 4 carbon atoms, a number average molecular weight of the polymer being 300 to 1,500, with (A-2) a polyester having a carboxyl group at least one terminal, a number average molecular weight of the polyester being 1,000 to 1,000,000; (B) a pigment; (C) a photopolymerization initiator; (D) a compound containing an ethylenically unsaturated double bond; and (E) a solvent.

(A) Specific Resin

The specific resin of the invention is obtained by reacting (A-1) a polymer of an alkylene imine having 2 to 4 carbon atoms, a number average molecular weight of the polymer being 300 to 1,500, with (A-2) a polyester having a carboxyl group at least one terminal, a number average molecular weight of the polyester being 1,000 to 1,000,000.

(A) The specific resin obtained by such a reaction has a main chain structure of a polymer of an alkylene imine having 2 to 4 carbon atoms, in which a polyester chain that is a residue formed by removing the OH group of the carboxylic group from (A-2) a polyester having a carboxyl group at one terminal is bonded as a side chain to a primary or secondary amine portion of the polymer. Therefore, the specific resin is a resin having a structure as follows.

Specific embodiments [(A-1) to (A-18)] of the specific resin of the invention are shown below by specific structures of repeating units in the resin and combinations thereof, but the invention is not limited thereto. In the following formula, k represents 1 or 2, l, m and n each represent the polymerization molar ratio of the repeating unit, l represents 10 to 90, m represents 0 to 80, n represents 0 to 70, and l+m+n=100. p and q represent a linking number of a polyester chain, and each independently represents 5 to 100,000. Y represents a hydrogen atom or an alkylcarbonyl group (polyester group).

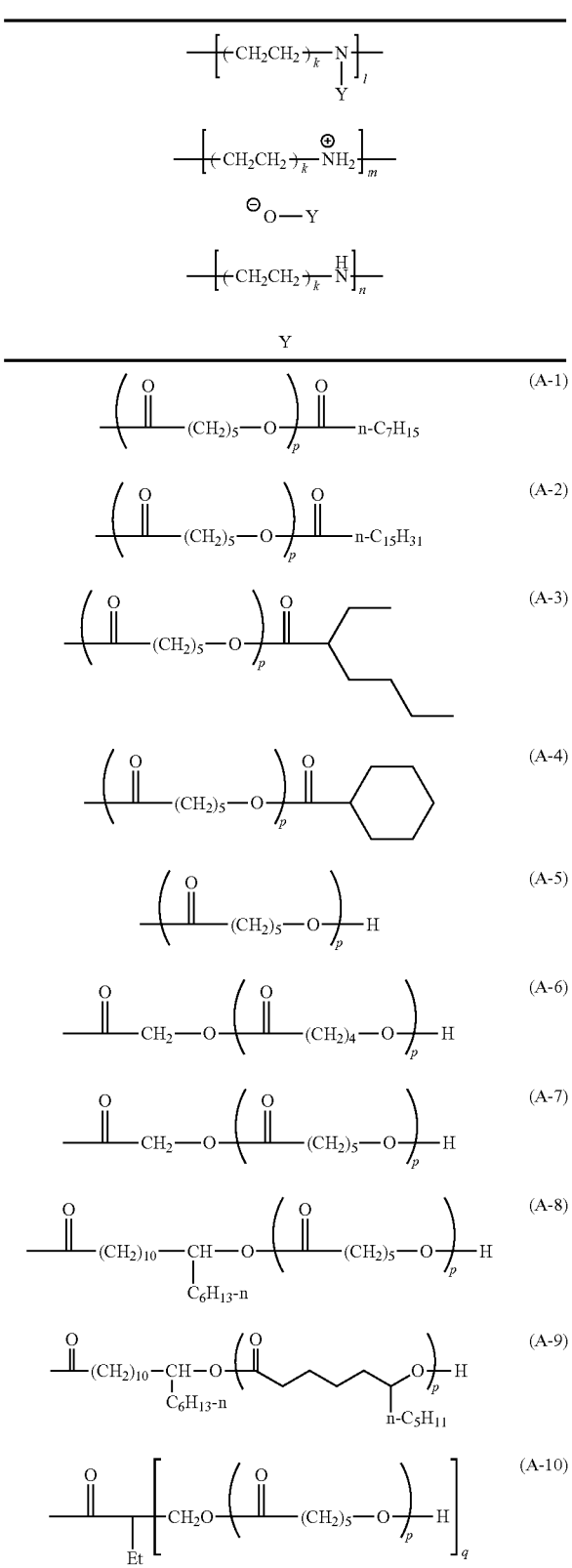

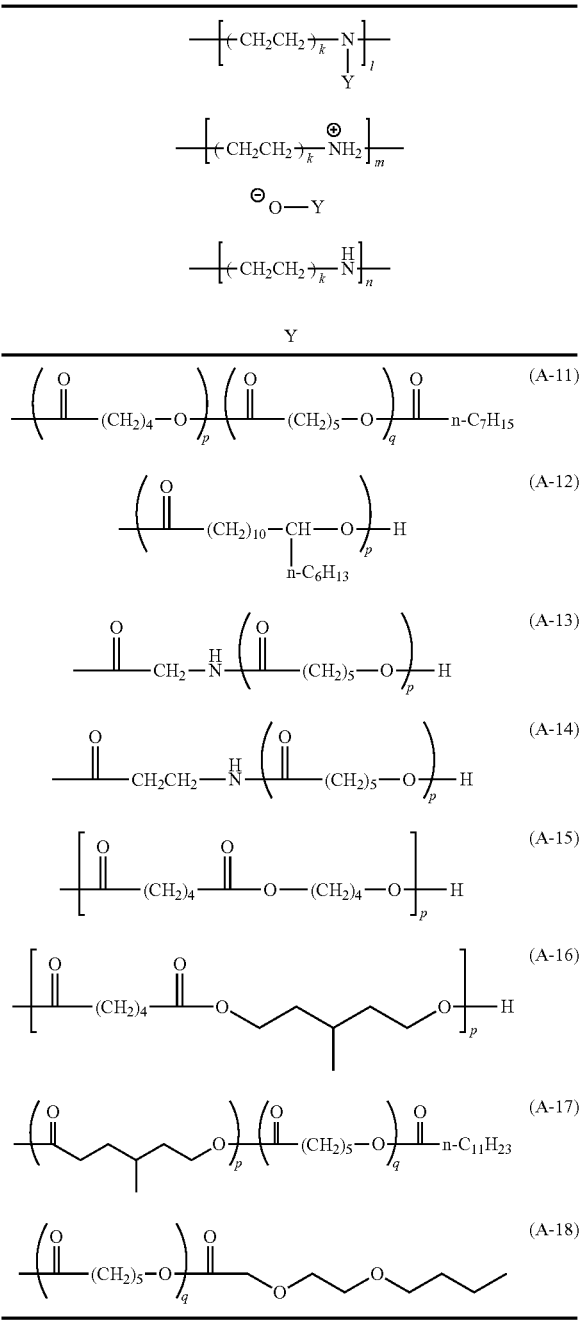

Description is made with respect to a raw material resin for producing such (A) specific resin.

<(A-1) Polymer of Alkylene Imine Having 2 to 4 Carbon Atoms Which has a Number Average Molecular Weight of 300 to 1,500: Specific Polyalkylene Imine>

The number of carbon atoms of an alkylene portion in (A-1) a polymer of an alkylene imine is preferably 2 to 4, but in particular, a polymer of ethylene imine with 2 carbon atoms (polyethylene imine) is most preferred. The polymer of an alkylene imine may be synthesized and used by known methods or a commercial polymer of an alkylene imine may be used.

The number average molecular weight of the polymer of an alkylene imine can be obtained by ebullioscopy. The number average molecular weight of the polymer of an alkylene imine is preferably 300 to 1,200, and most preferably 500 to 1,200. The dispersibility of a fine pigment is increased by using the range.

The reason is unknown, but it is presumed as follows. A portion which is composed of the polymer of an alkylene imine has adsorptivity to pigment, but when the number average molecular weight is less than 300, adsorptivity to pigment is weak and dispersibility and dispersion stability are insufficient. On the other hand, it is thought that, when a number average molecular weight exceeds 1500, chain length of a portion which is composed of a polymer of an alkylene imine becomes too long and thereby pigments generate a pseudo-crosslink with each other and therefore dispersibility and dispersion stability are insufficient. In particular, this is prominently observed when fine pigments are used.

On the other hand, it is thought that, when a number average molecular weight of the polymer of an alkylene imine is in the range of 300 to 1500, adsorptivity to pigment is strong, and pigments do not generate a pseudo-crosslink with each other, and therefore dispersibility and dispersion stability are remarkably good even with fine pigments.

Furthermore, when a number average molecular weight of a polymer of an alkylene imine is in the range of 300 to 1500, adhesion property to a substrate is unexpectedly increased. The cause is unclear, but it is thought to be as follows. It is presumed that a portion which is composed of the polymer of an alkylene imine acts on the adhesion property to a substrate. In the case in which a portion which is composed of the polymer of an alkylene imine has a number average molecular weight of less than 300, it cannot be bonded strongly to a substrate, and thus the adhesion property to a substrate becomes insufficient. It is thought that, when a portion which is composed of the polymer of an alkylene imine has a number average molecular weight of more than 1500, the portion has preferential adsorption to the pigment rather than to the substrate, and thus the adhesion property to a substrate becomes insufficient.

<(A-2) Polyester Having a Carboxyl Group at Least One Terminal Which has a Number Average Molecular Weight of 1,000 to 1,000,000: Specific Polyester>

(A-2) The polyester having a carboxyl group at least one terminal is obtained by (i) polycondensation of carboxylic acid and lactone, (ii) polycondensation of a hydroxy group-containing carboxylic acid, (iii) polycondensation of dihydric alcohol and divalent carboxylic acid (or cyclic acid anhydride).

Examples of the carboxylic acids to be used in (i) include aliphatic carboxylic acid (a linear or branched carboxylic acid having 1 to 30 carbon atoms is preferred such as formic acid, acetic acid, propionic acid, butyric acid, valeric acid, n-hexanoic acid, n-octanoic acid, n-decanoic acid, n-dodecanoic acid, palmitic acid, 2-ethyl hexanoic acid, and cyclohexanoic acid), and a hydroxy group-containing carboxylic acid (a linear or branched hydroxy group-containing carboxylic acid having 1 to 30 carbon atoms is preferred such as glycolic acid, lactic acid, 3-hydroxy propionic acid, 4-hydroxy dodecanoic acid, 5-hydroxy dodecanoic acid, ricinoleic acid, 12-hydroxy dodecanoic acid, 12-hydroxy stearic acid, and 2,2-bis(hydroxymethyl)butyric acid), and linear aliphatic carboxylic acid having 6 to 20 carbon atoms or hydroxyl group-containing carboxylic acid having 1 to 20 carbon atoms is preferred. These carboxylic acids may be used by mixing them.

The lactone may be known lactones. Examples thereof include β-propiolactone, β-butyrolactone, γ-butyrolactone, γ-hexanolactone, γ-octanolactone, δ-valerolactone, δ-hexanolactone, δ-octanolactone, ε-caprolactone, δ-dodecanolactone, and α-methyl-γ-butyrolactone. In particular, ε-caprolactone is preferred from the viewpoint of reactivity and availability. These lactones may be used by mixing them. An addition ratio when carboxylic acid and lactone are reacted cannot be exclusively determined due to dependence on the molecular weight of intended polyester chain, but the ratio of carboxylic acid to lactone is preferably 1:1 to 1:1,000, and is particularly preferably 1:3 to 1:500.

The hydroxyl group-containing carboxylic acid in (ii) has the same definition as the hydroxyl group-containing carboxylic acid in the above (i) and has the same preferable definition as in the above (i).

Examples of dihydric alcohol in (iii) include a linear or branched aliphatic diol (diol having 2 to 30 carbon atoms is preferred such as ethylene glycol, diethylene glycol, triethylene glycol, dipropylene glycol, 1,2-propanediol, 1,3-propanediol, 1,5-pentanediol, 1,6-hexanediol, and 1,8-octanediol). In particular, aliphatic diol having 2 to 20 carbon atoms is preferred.

Furthermore, examples of the divalent carboxylic acid include a linear or branched divalent aliphatic carboxylic acid (divalent aliphatic carboxylic acid having 1 to 30 carbon atoms is preferred such as succinic acid, maleic acid, adipic acid, sebacic acid, dodecanedioic acid, glutaric acid, suberic acid, tartaric acid, oxalic acid, and malonic acid). In particular, divalent carboxylic acid having 3 to 20 carbon atoms is preferred. Furthermore, acid anhydrides (for example, anhydrous succinic acid, anhydrous glutaric acid) equivalent to these divalent carboxylic acids may be used.

It is preferred that the divalent carboxylic acid and the dihydric alcohol are charged at 1:1 molar ratio. Thereby, the carboxylic acid can be introduced at the terminal.

It is preferred that the polycondensation at the time of producing polyester is performed by adding catalysts. A catalyst acting as Lewis acid is preferred such as Ti compound (for example, $Ti(OBu)_4$, and $Ti(O-i-Pr)_4$), Sn compound (for example, tin octylate, dibutyltin oxide, dibutyltin laurate, monobutyltin hydroxybutyl oxide, and stannic chloride), and protonic acid (for example, sulfuric acid, and paratoluene sulfonic acid). The amount of catalyst to be added is preferably 0.01 to 10 mol % and most preferably 0.1 to 5 mol %, with respect to the molar number of total monomers. Reaction temperature is preferably 80 to 250° C. and most preferably 100 to 180° C. The reaction time varies depending on reaction conditions, but is generally 1 to 24 hours.

The number average molecular weight of polyester can be measured in terms of polystyrene by GPC. The number average molecular weight of (A-2) polyester which may be used in the invention is 1,000 to 1,000,000, preferably 2,000 to 100,000 and more preferably 3,000 to 50,000. In the case in which the molecular weight is within the range, both dispersibility and developability can be satisfied.

As (A-2) polyester to be used in the invention, the polyester obtained in (i) and (ii) is preferred due to ease of production.

(A) The specific resin can be obtained by reacting (A-1) a polymer of an alkylene imine with (A-2) a polyester containing a carboxyl group at least one terminal. It is preferred that the poly(lower alkylene imine) and the polyester containing a carboxyl group at one terminal are reacted at a mass ratio of 1:50 to 1:2. The dispersibility becomes good by using this range. The reaction temperature is preferably 50 to 250° C. and most preferably 70 to 150° C. The reaction time is preferably 0.5 to 24 hours.

The reaction may be performed under the presence of a solvent. Examples of the solvents include sulfoxide compounds (for example, dimethyl sulfoxide), ketone compounds (for example, acetone, methyl ethyl ketone, and cyclohexanone), ester compounds (for example, ethyl acetate, butyl acetate, ethyl propionate, and propylene glycol monomethyl ether acetate), ether compounds (for example, diethyl ether, dibutyl ether, and tetrahydrofuran), aliphatic hydrocarbon compounds (for example, pentane, and hexane), aromatic hydrocarbon compounds (for example, toluene, xylene, and mesitylene), nitrile compounds (for example, acetonitrile, and propionitrile), amide compounds (for example, N,N-dimethyl formamide, N,N-dimethyl acetamide, and N-methyl pyrrolidone), carboxylic acid compounds (for example, acetic acid, and propionic acid), alcohol compounds (for example, methanol, ethanol, isopropanol, n-butanol, 3-methyl butanol, and 1-methoxy-2-propanol), halogenated solvents (for example, chloroform, and 1,2-dichloroethane). In the case in which solvents are used, they are preferably 0.1 to 100 times by mass and most preferably 0.5 to 10 times by mass with respect to the substance.

With respect to (A) the specific resin of the invention, it is preferred that acid anhydride, diketene or sultone is further reacted with a resin obtained by reacting (A-1) a polymer of an alkylene imine having 2 to 4 carbon atoms which has a number average molecular weight of 300 to 1,500 with (A-2) a polyester having a carboxyl group at least one terminal which has a number average molecular weight of 1,000 to 1,000,000, to introduce an alkali-soluble group. Thereby, the dispersion stability and developability are further increased.

The acid anhydrides may be known acid anhydrides. Examples of the acid anhydrides include succinic anhydride, glutaric anhydride, itaconic anhydride, maleic anhydride, allyl succinic anhydride, butyl succinic anhydride, n-octyl succinic anhydride, n-decyl succinic anhydride, n-dodecyl succinic anhydride, n-tetradecyl succinic anhydride, n-docosenyl succinic anhydride, (2-hexen-1-yl)succinic anhydride, (2-methyl propen-1-yl)succinic anhydride, (2-dodecen-1-yl)succinic anhydride, n-octenyl succinic anhydride, (2,7-octanedien-1-yl)succinic anhydride, acetyl malic anhydride, diacetyl tartaric anhydride, het anhydride, cyclohexane-1,2-dicarboxylic anhydride, 3 or 4-methyl cyclohexane-1,2-dicarboxylic anhydride, tetrafluorosuccinic anhydride, 3 or 4-cyclohexene-1,2-dicarboxylic anhydride, 4-methyl-4-cyclohexene-1,2-dicarboxylic anhydride, phthalic anhydride, and tetrachlorophthalic anhydride, naphthalic anhydride, bicycle[2.2.2]oct-7-en-2,3,5,6-tetracarboxylic dianhydride, pyromellitic dianhydride, meso-butane-1,2,3,4-tetracarboxylic dianhydride, and 1,2,3,4-cyclopentane carboxylic dianhydride).

The sultone may be known sultone such as butane sultone, and propane sultone.

Among the acid anhydrides, in particular, an acid anhydride with 4 to 20 carbon atoms is preferred, and an acid anhydride with 4 to 10 carbon atoms is more preferred from the viewpoint of dispersion stability and developability.

(A) The specific resin of the invention is preferably 5 to 80% by mass and more preferably 10 to 70% by mass with respect to (B) pigment. Within this range, the dispersibility and color density are good, and pattern formability is also good in the case of using a colored photocurable composition.

(B) Pigment

As pigments to be used in the invention, conventionally known various inorganic or organic pigments may be used and high transmissive pigment is preferred.

Examples of the inorganic pigments include metal compounds such as metal oxides, and metal complexes, and specifically include oxides of metals such as iron, cobalt, aluminum, cadmium, lead, copper, titanium, magnesium, chromium, zinc, and antimony, and composite oxides of the metals.

Examples of organic pigments include:
C.I. pigment yellow 11, 24, 31, 53, 83, 93, 99, 108, 109, 110, 138, 139, 147, 150, 151, 154, 155, 167, 180, 185, 199;
C.I. pigment orange 36, 38, 43, 71;
C.I. pigment red 81, 105, 122, 149, 150, 155, 171, 175, 176, 177, 209, 220, 224, 242, 254, 255, 264, 270;
C.I. pigment violet 19, 23, 32, 39;
C.I. pigment blue 1, 2, 15, 15:1, 15:3, 15:6, 16, 22, 60, 66, 79, pigment obtained by changing CI substituent of C.I. pigment blue 79 to OH, C.I. pigment blue 80;
C.I. pigment green 7, 36, 37, 58;
C.I. pigment brown 25, 28; and
C.I. pigment black 1, 7.

In the invention, in particular, a pigment having a structural formula having a basic N atom may be preferably used. These pigments with basic N atoms show good dispersibility in the composition of the invention. The cause has not been sufficiently established, but it is presumed that the affinity of the photosensitive polymerization component and the pigment has an effect on the dispersibility.

Examples of the pigments to be preferably used in the invention include the following, provided that the invention is not specifically limited thereto.
C.I. pigment yellow 11, 24, 108, 109, 110, 138, 139, 150, 151, 154, 167, 180, 185,
C.I. pigment orange 36, 71,
C.I. pigment red 122, 150, 171, 175, 177, 209, 224, 242, 254, 255, 264,
C.I. pigment violet 19, 23, 32,
C.I. pigment blue 15:1, 15:3, 15:6, 16, 22, 60, 66,
C.I. pigment green 7, 36, 37, 58;
C.I. pigment black 1, 7

These organic pigments are used singly or in various combinations for spectroscopic adjustment or an increase in color purity. Specific examples of the combinations are shown below. For example, a combination of at least one red pigment of anthraquinone-based pigment, perylene-based pigment, or diketopyrrolopyrrole-based pigment with disazo-based yellow pigment, isoindoline-based yellow pigment, quinophthalone-based yellow pigment or perylene-based red pigment may be used. For example, examples of the anthraquinone-based pigments include C.I. pigment red 177, examples of the perylene-based pigments include C.I. pigment red 155 and C.I. pigment red 224, and examples of the diketopyrrolopyrrole-based pigments include C.I. pigment red 254. A mixture with C.I. pigment yellow 139 is preferred in view of color separation. Furthermore, a mass ratio of red pigment to yellow pigment is preferably from 100:5 to 100:50. When the ratio is 100:4 or less, it is difficult to suppress the light transmission of from 400 nm to 500 nm. Furthermore, when the ratio is 100:51 or more, there is a case where the main wavelength is shifted to shorter wavelength so that color separation ability cannot be increased. In particular, the mass ratio is optimum in the range of from 100:10 to 100:30. Furthermore, in the case of combination of the red pigments, the ratio can be adjusted according to the required spectroscopic property.

Further, green pigments may be a halogenated phthalocyanine-based pigment alone or a mixture thereof with disazo-based yellow pigment, quinophthalone-based yellow pigment, azomethine-based yellow pigment or isoindoline-based yellow pigment. For example, there is preferred a mixture of C.I. pigment Green 7, 36, 37, 58 with C.I. pigment yellow 83, C.I. pigment yellow 138, C.I. pigment yellow 139, C.I. pigment yellow 150, C.I. pigment yellow 180 or C.I. pigment yellow 185. The mass ratio of green pigment to yellow pigment is preferably 100:5 to 100:150. In particular, the mass ratio is preferably in the range of 100:30 to 100:120.

The blue pigment may be a phthalocyanine-based pigment alone or a mixture of dioxazine-based violet pigment with the phthalocyanine-based pigment. For example, a mixture of C.I. pigment blue 15:6 with C.I. pigment violet 23 is preferred. The mass ratio of blue pigment to violet pigment is preferably 100:0 to 100:100, and more preferably 100:10 or less.

Furthermore, as pigments for black matrix, carbon, titanium black, iron oxide, and titanium oxide may be used alone or in a mixture thereof, and a combination of carbon with titanium black is preferred. Furthermore, the mass ratio of carbon to titanium black is preferably in the range of 100:0 to 100:60.

In the case in which the pigment is used for a color filter, the primary particle diameter of the pigment is preferably 100 nm or less from the viewpoint of color unevenness and contrast, and is 5 nm or more from the viewpoint of dispersion stability. The primary particle diameter of the pigment is more preferably 5 to 50 nm, more preferably 5 to 40 nm, and particularly preferably 5 to 35 nm. In particular, the specific resin of the invention can exert its effect in the range of 5 to 35 nm.

The primary particle diameter of the pigment can be measured by a known method such as an electron microscope.

Among these, the pigments are preferably selected from anthraquinone-based, azomethine-based, benzylidene-based, cyanine-based, diketopyrrolopyrrole-based and phthalocyanine-based pigments.

In the invention, there is a preferable embodiment where, (A) specific resin, (B) pigment, and, if necessary, (E) solvent are used and are dispersed in advance to prepare pigment dispersion liquid, to which (C) a photopolymerization initiator and (D) a compound containing ethylenically unsaturated double bond is added to make a colored curable composition. Pigment dispersibility can be increased by preparing the pigment dispersion liquid in advance, and production of the colored curable composition can be performed reasonably.

The content of the pigment in pigment dispersion liquid is preferably 30 to 70% by mass, more preferably 35% by mass or more, and most preferably 40% by mass or more with respect to total solid content in the pigment dispersion liquid. In the case of 40% by mass or more, the specific resin can particularly exert its effect.

(E) Solvent

The pigment dispersion liquid of the invention contains at least one solvent. Examples of (E) the solvent include a liquid selected from organic solvents described below. The solvent may be selected considering the solubility and dispersibility of the respective components contained in a pigment dispersion liquid, dispersion stability and the coating properties of the curable composition. The solvent is basically not particularly restricted as long as it satisfies the desired properties, and is preferably selected in consideration of safety.

Preferable specific examples of the solvent include esters, for example, ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate;

ethers, for example, diethyleneglycol dimethyl ether, tetrahydrofuran, ethyleneglycol monomethyl ether, ethyleneglycol monoethyl ether, methyl cellosolve acetate (ethyleneglycol monomethyl ether acetate), ethyl cellosolve acetate (ethyleneglycol monoethyl ether acetate), diethyleneglycol monomethyl ether, diethyleneglycol monoethyl ether, diethyleneglycol monobutyl ether, diethyleneglycol monoethyl ether acetate, diethyleneglycol monobutyl ether acetate, propylene glycol methyl ether, propylene glycol monomethyl ether acetate, propylene glycol ethyl ether acetate, and propylene glycol propyl ether acetate;

ketones, for example, methyl ethyl ketone, cyclohexanone, 2-heptanone, and 3-heptanone; and aromatic hydrocarbons, for example, toluene and xylene.

Among them, methyl 3-ethoxypropionate, ethyl 3-ethoxypropionate, ethyl cellosolve acetate, ethyl lactate, diethyleneglycol dimethyl ether, butyl acetate, methyl 3-methoxypropionate, 2-heptanone, cyclohexanone, diethyleneglycol monoethyl ether acetate, diethyleneglycol monobutyl ether acetate, propylene glycol methyl ether, and propylene glycol monomethyl ether acetate (PGMEA) are more preferred.

The content of (E) the solvent in the pigment dispersion liquid to be used in the invention is preferably from 50 to 90% by mass, more preferably from 60 to 95% by mass, and most preferably from 70 to 90% by mass. When the content of solvent is in the above range, it is advantageous in view of suppressing generation of foreign substances.

It is preferred that the pigment dispersion liquid of the invention further contains pigment derivatives. In particular, dispersibility and dispersion stability are significantly improved by containing the pigment derivatives having an acidic group.

As the pigment derivatives, a structure obtained by replacing a portion of organic pigment, anthraquinones or acridones with an acidic group, a basic group or a phthalimide methyl group is preferred. Examples of the organic pigments for forming the pigment derivatives include diketopyrrolopyrrole-based pigment, azo-based pigments such as azo, disazo, and polyazo, phthalocyanine-based pigments such as copper phthalocyanine, halogenated copper phthalocyanine and metal-free phthalocyanine, anthraquinone-based pigments such as aminoanthraquinone, diaminodianthraquinone, anthrapyrimidine, flavanthrone, anthanthrone, indanthrone, pyranthrone, and violanthrone, quinacridone-based pigments, dioxazine-based pigments, perinone-based pigments, perylene-based pigments, thioindigo-based pigments, isoindoline-based pigments, isoindolinone-based pigments, quinophthalone-based pigments, threne-based pigments, metal complex-based pigments.

Preferable examples of the acidic group which the pigment derivatives have include sulfonic acid, carboxylic acid and quaternary ammonium salt thereof. Furthermore, the basic group which the pigment derivatives have is preferably an amino group.

The amount of the pigment derivative to be used is not specifically limited, but it is preferably used in an amount of from 5 to 80% by mass and more preferably from 10 to 50% by mass, with respect to the pigment.

As dispersion assistants, dispersants such as polymer dispersants [for example, polyamidoamines and salts thereof, polycarboxylic acids and salts thereof, high molecular unsaturated acid esters, modified polyurethanes, modified polyesters, modified poly(meth)acrylates, (meth)acrylic copolymers, and formalin condensates of naphthalene sulfonic acid], and polyoxyethylene alkyl phosphoric esters, polyoxyethylene alkylamines, alkanolamines, can be added to the pigment dispersion liquid of the invention.

The polymer dispersants can be further categorized into linear polymers, terminal modified polymers, graft polymers, and block polymers, based on their structures.

A polymer dispersant is adsorbed on the surface of the pigment, and works to prevent the pigment from re-aggregating. Accordingly, preferable structures of the polymer dispersant include terminal modified polymers, graft polymers, and block polymers, each of which has an anchoring site to the pigment surface.

Specific examples of pigment dispersants usable in the invention include DISPERBYK 101 (polyamidoamine phosphate), 107 (carboxylic ester), 110 (acid group-containing copolymer), 130 (polyamide), 161, 162, 163, 164, 165, 166, and 170 (high molecular copolymer), and BYK-P104 and P105 (high molecular unsaturated polycarboxylic acid) (produced by BYK Chemie); EFKA 4047, 4050, 4010, and 4165 (polyurethane-based), EFKA 4330, 4340 (block copolymer), 4400, 4402 (modified polyacrylate), 5010 (polyester amide), 5765 (high molecular polycarboxylic acid salt), 6220 (fatty acid polyester), 6745 (phthalocyanine derivative), and 6750 (azo pigment derivative) (produced by EFKA); AJISPER PB821 and PB822 (produced by Ajinomoto Fine-Techno Co., Inc.); FLOWLEN TG-710 (urethane oligomer) and POLYFLOW Nos. 50E and 300 (acrylic copolymer) (produced by Kyoeisha Chemical Co., Ltd.); DISPARLON KS-860, 873SN, 874, #2150 (aliphatic polycarboxylic acid), #7004 (polyether ester), DA-703-50, DA-705, and DA-725 (produced by Kusumoto Chemicals, Ltd.); DEMOL RN, N (naphthalenesulfonic acid formalin polycondensate), MS, C, SN-B (aromatic sulfonic acid formalin polycondensate), HOMOGENOL L-18 (high molecular polycarboxylic acid), EMULGEN 920, 930, 935, and 985 (polyoxyethylene nonyl phenyl ether), and ACETAMIN 86 (stearylamine acetate) (produced by Kao Corporation); SOLSPERSE 5000 (phthalocyanine derivative), 22000 (azo pigment derivative), 13240 (polyester amine), 3000, 17000, 27000 (polymer having a functional part at a terminal), 24000, 28000, 32000, and 38500 (graft polymers) (produced by The Lubrizol Corporation); and NIKKOL T106 (polyoxyethylene sorbitan monooleate) and MYS-IEX (polyoxyethylene monostearate) (produced by Nikko Chemicals Co., Ltd).

These dispersion assistants may be used singly, or in combination of two or more kinds thereof. In the case in which the dispersion assistant is used, the content of the dispersion assistant is preferably from 1 to 100% by mass, more preferably from 3 to 80% by mass, and most preferably from 5 to 50% by mass, with respect to the specific resin of the invention.

The colored curable composition of the invention includes (C) a photopolymerization initiator and (D) a compound having an ethylenically unsaturated double bond, and thereby a colored curable composition having excellent pattern resolution, color properties, coating properties, and developability can be provided.

(C) Photopolymerization Initiator

The curable composition of the invention includes a photopolymerization initiator in order to improve sensitivity and pattern formability. (C) The photopolymerization initiator of the invention is a compound which is decomposed by light, thereby initiating and accelerating polymerization of the polymerizable component in the invention. The photopolymerization initiator preferably has an absorption in the wavelength region of from 300 nm to 500 nm. The photopolymerization initiator may be used singly, or in combination of two or more kinds thereof.

Examples of the photopolymerization initiators include organic halogenated compounds, oxydiazole compounds, carbonyl compounds, ketal compounds, benzoin compounds, acridine compounds, organic peroxide compounds, azo compounds, coumarin compounds, azide compounds, metallocene compounds, hexaarylbiimidazole compounds, organic borate compounds, disulfonic acid compounds, oxime ester compounds, onium salt compounds, acylphosphine (oxide) compounds, and alkylamino compound.

These compounds are described below in detail.

Specific examples of the organic halogenated compounds include the compounds described in Wakabayashi et al., "Bull. Chem. Soc. Japan" 42, 2924 (1969), U.S. Pat. No. 3,905,815, Japanese Patent Publication (JP-B) No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243 and JP-A No. 63-298339, and M. P. Hutt, "Journal of Heterocyclic Chemistry" Vol. 1, No. 3 (1970). In particular, examples include oxazole compounds and s-triazine compounds substituted by a trihalomethyl group.

Preferable examples of the s-triazine compounds include a s-triazine derivative in which at least one monohalogen-, dihalogen-, or trihalogen-substituted methyl group is bonded to an s-triazine ring, specific examples of which include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxodiazole compounds include 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, and 2-trichloromethyl-5-(4-styryl)styryl-1,3,4-oxodiazole.

Examples of the carbonyl compounds include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenyl ketone, α-hydroxy-2-methylphenylpropanone, 1-hydroxy-1-methylethyl-(p-isopropylphenyl) ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxantone, 2-isopropylthioxantone, 2-chlorothioxantone, 2,4-dimethylthioxantone, 2,4-diethylthioxantone, and 2,4-diisopropylthioxantone; and benzoic ester derivatives such as ethyl p-dimethylaminobenzoate and ethyl p-diethylaminobenzoate.

Examples of the ketal compounds include benzyl methyl ketal and benzyl-β-methoxyethyl ethyl acetal.

Examples of the benzoin compounds include, for example, m-benzoin isopropyl ether, benzoin isobutyl ether, benzoin methyl ether, and methyl o-benzoylbenzoate.

Examples of the acridine compounds include 9-phenylacridine and 1,7-bis(9-acridinyl)heptane.

Examples of the organic peroxide compounds include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate), and carbonyl di(t-hexylperoxy dihydrogen diphthalate).

Examples of the azo compounds include the azo compounds described in JP-A No. 8-108621.

Examples of the coumarin compounds include 3-methyl-5-amino-((s-triazin-2-yl)amino)-3-phenylcoumarin, 3-chloro-5-diethylamino-((s-triazin-2-yl)amino)-3-phenylcoumarin, and 3-butyl-5-dimethylamino-((s-triazin-2-yl)amino)-3-phenylcoumarin.

Examples of the azide compounds include the organic azide compounds described in U.S. Pat. Nos. 2,848,328, 2,852,379 and 2,940,853, and 2,6-bis-(4-azidobenzylidene)-4-ethylcyclohexanone (BAC-E).

Examples of the metallocene compounds include various titanocene compounds described in JP-A No. 59-152396, JP-A No. 61-151197, JP-A No. 63-41484, JP-A No. 2-249, JP-A No. 2-4705 and JP-A No. 5-83588, for example, di-cyclopentadienyl-Ti-bis-phenyl, dicyclopentadienyl-Ti-bis-2,6-difluorophen-1-yl, di-cyclopentadienyl-Ti-bis-2,4-difluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl; and the iron-arene complexes described in JP-A No. 1-304453 and JP-A No. 1-152109.

Examples of the hexaarylbiimidazole compounds include various compounds described in JP-B No. 6-29285, U.S. Pat. Nos. 3,479,185, 4,311,783, and 4,622,286, specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5=-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic borate compounds include the organic boric acid salts described in JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769 and Japanese Patent Application No. 2000-310808, Kunz, Martin, "Rad Tech '98, Proceedings, Apr. 19-22, 1998, Chicago"; the organic boron-sulfonium complexes or organic boron-oxosulfonium complexes described in JP-A No. 6-157623, JP-A No. 6-175564 and JP-A No. 6-175561; the organic boron-iodonium complexes described in JP-A No. 6-175554 and JP-A No. 6-175553; the organic boron-phosphonium complexes described in JP-A No. 9-188710; and the organic boron-transition metal coordination complexes described in JP-A No. 6-348011, JP-A No. 7-128785, JP-A No. 7-140589, JP-A No. 7-306527 and JP-A No. 7-292014.

Examples of the disulfone compounds include, for example, the compounds described in JP-A No. 61-166544 and Japanese Patent Application No. 2001-132318.

Examples of the oxime ester compounds include compounds described in J. C. S. Perkin II (1979) 1653-1660, J. C. S. Perkin II (1979) 156-162, Journal of Photopolymer Science and Technology (1995) 202-232, and JP-A No. 2000-66385; and the compounds described in JP-A No. 2000-80068 and JP-A No. 2004-534797.

Examples of onium salt compounds include diazonium salts described in S. I. Schlesinger, Photogr. Sci. Eng., 18, 387 (1974) and T. S. Bal et al, Polymer, 21, 423 (1980), ammonium salts described in U.S. Pat. No. 4,069,055 and JP-A No. 4-365049, phosphonium salts described in U.S. Pat. Nos. 4,069,055 and 4,069,056, iodonium salts described in EP No. 104,143, U.S. Pat. Nos. 339,049 and 410,201 and JP-A No. 2-150848 and JP-A No. 2-296514.

An iodonium salt that can be suitably used in the present invention is a diaryl iodonium salt, which is preferably substituted by two or more electron-donating groups, such as an alkyl group, an alkoxy group, or an aryloxy group, from the viewpoint of stability. Further, another preferable example of the sulfonium salt is an iodonium salt having absorption at a wavelength of 300 nm or more in which one substituent of a triarylsulfonium salt has a coumarin or anthraquinone structure.

Examples of sulfonium salts that suitably can be used in the invention include sulfonium salts described in EP No. 370,693, EP No. 390,214, EP No. 233,567, EP No. 297,443 and EP No. 297,442, U.S. Pat. Nos. 4,933,377, 161,811, 410,201, 339,049, 4,760,013, 4,734,444 and 2,833,827, and GP No. 2,904,626, GP No. 3,604,580 and GP No. 3,604,581. The sulfonium salt is preferably substituted by an electron-withdrawing group from the viewpoint of stability and sensitivity. The electron-withdrawing group preferably has a Hammett value of larger than 0. Examples of preferable electron-withdrawing groups include a halogen atom and a carboxylic acid.

Furthermore, other preferable examples of the sulfonium salt include a sulfonium salt having absorption at a wavelength of 300 nm or more in which one substituent of a triarylsulfonium salt has a coumarin or anthraquinone structure. Other preferable examples of the sulfonium salt include a sulfonium salt having absorption at a wavelength of 300 nm or more in which a triarylsulfonium salt has an aryloxy group or an arylthio group as a substituent.

Examples of the onium salt compound include onium salts such as selenonium salts described in Macromolecules, 10(6), 1307 (1977) by J. V. Crivello et al. and J. Polymer Sci., Polymer Chem. Ed., 17, 1047 (1979) by J. V. Crivello et al.; and arsonium salts described in Teh, Proc. Conf. Rad. Curing ASIA, p. 478 Tokyo, October (1988) by C. S. Wen et al.

Examples of acyl phosphine (oxide) compounds include IRGACURE 819, DAROCUR 4265, and DAROCUR TPO (produced by Ciba Specialty Chemicals Inc.).

Examples of alkyl amino compound include a compound having a dialkyl amino phenyl group or alkyl amine compound described in paragraph [0047] of JP-A No. 9-281698, JP-A No. 6-19240 and JP-A No. 6-19249. Specifically, examples of the compound having a dialkyl amino phenyl group include compounds such as ethyl p-dimethyl amino benzoate or dialkylaminophenyl carbaldehydes such as p-diethylaminobenzcarbaldehyde, and 9-julolidyl carbaldehyde, and examples of the alkyl amine compounds include triethanolamine, diethanolamine, and triethylamine.

(C) The photopolymerization initiator to be used in the invention is preferably a compound selected from the group consisting of a triazine-based compound, an alkyl amino compound, a benzyl dimethyl ketal compound, an α-hydroxyketone compound, an α-aminoketone compound, an acyl phosphine compound, a phosphine oxide-based compound, a metallocene compound, an oxime-based compound, a biimidazole-based compound, an onium-based compound, a benzothiazole-based compound, a benzophenone-based compound, an acetophenone-based compound and derivatives thereof, a cyclopentadiene-benzene-iron complex and salts thereof, a halomethyl oxadiazole compound, and a 3-aryl-substituted coumarin compound, from the viewpoint of exposure sensitivity.

The photopolymerization initiator is more preferably a triazine-based compound, an alkyl amino compound, an α-aminoketone compound, an acyl phosphine-based compound, a phosphine oxide-based compound, an oxime-based compound, a biimidazole-based compound, an onium-based compound, a benzophenone-based compound, and an acetophenone-based compound, and still more preferably at least one type of compound selected from the group consisting of a triazine-based compound, an alkyl amino compound, an oxime-based compound, and a biimidazole-based compound.

In particular, in the case in which the colored curable composition of the invention is used in forming a colored pixel in a color filter of a solid-state imaging device, the pigment concentration in the colored curable composition is increased and thus the amount of the initiator to be added is reduced and sensitivity is deteriorated, in view of formulation. Furthermore, when exposure is performed in a stepper, if an initiator generating a halogen-containing compound at the time of exposure such as triazine-based compounds is used, it is a cause of apparatus corrosion and thus it is difficult to use the initiator. Considering these, a photopolymerization initiator satisfying sensitivity and various performances is preferably an oxime-based compound, and in particular, an oxime-based compound having absorption at 365 nm is most preferred.

The content of (C) the photopolymerization initiator is preferably from 0.1% by mass to 50% by mass, more preferably from 0.5% by mass to 30% by mass, and still more preferably from 1% by mass to 20% by mass, with respect to the total solid content of the colored curable composition of the invention. When the content of photopolymerization initiator is within the above range, excellent sensitivity and pattern forming properties are obtained.

(D) Compound Containing Ethylenically Unsaturated Double Bond

A compound having an ethylenically unsaturated double bond which can be used in the colored curable composition of the invention is an addition-polymerizable compound having at least one ethylenically unsaturated double bond. The compound is selected from compounds each having at least one terminal ethylenically unsaturated bond, preferably having two or more terminal ethylenically unsaturated bonds. Such compounds are widely known in the relevant industrial field, and such compounds may be used in the invention without particular limitations. Such compounds may have a chemical form of a monomer or a prepolymer (in other words, a dimer, a trimer, or an oligomer), or a mixture thereof, or a copolymer thereof.

Examples of the monomer and copolymers thereof include an unsaturated carboxylic acid (for example, acrylic acid, methacrylic acid, itaconic acid, crotonic acid, isocrotonic acid, or maleic acid), esters thereof, amides thereof. An ester of an unsaturated carboxylic acid and an aliphatic polyhydric alcohol compound, or an amide of an unsaturated carboxylic acid and an aliphatic polyamine compound, is preferably used. An addition reaction product of an unsaturated carboxylic ester or amide having a nucleophilic substituent such as a hydroxyl group, an amino group or a mercapto group, with a monofunctional or polyfunctional, isocyanate or epoxy compound, and a dehydration condensation reaction product of such an unsaturated carboxylic ester or amide having a nucleophilic substituent with a monofunctional or polyfunctional carboxylic acid, are suitably used. An addition reaction product of an unsaturated carboxylic ester or amide having an electrophilic substituent such as an isocyanate group or an epoxy group, with monofunctional or polyfunctional alcohols, amines, or thiols, and a substitution reaction product of an unsaturated carboxylic ester or amide having a halogen group or having a leaving substituent such as a tosyloxy group, with a monofunctional or polyfunctional alcohols, amines, or thiols, are also preferable. Other examples include, for example, a compound obtained by replacing the unsaturated carboxylic acid in any of the above examples with an unsaturated phosphonic acid, styrene, or vinyl ether.

As specific examples of the ester monomer of an aliphatic polyhydric alcohol compound and an unsaturated carboxylic acid, the acrylic esters include, for example, ethyleneglycol diacrylate, triethyleneglycol diacrylate, 1,3-butanediol diacrylate, tetramethyleneglycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and isocyanuric acid EO-modified triacrylate.

The methacrylic esters include, for example, tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

The itaconic esters include, for example, ethyleneglycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. The crotonic esters include, for example, ethyleneglycol dicrotonate, tetramethylene glycol dicrotonate, pentaerythritol dicrotonate, and sorbitol tetradicrotonate. The isocrotonic esters include, for example, ethyleneglycol diisocrotonate, pentaerythritol diisocrotonate, and sorbitol tetraisocronate. The maleic esters include, for example, ethyleneglycol dimaleate, triethyleneglycol dimaleate, pentaerythritol dimaleate, and sorbitol tetramaleate.

Examples of other esters include the aliphatic alcohol-based esters described in JP-B No. 51-47334 and JP-A No. 57-196231, the aromatic skeleton-containing compounds described in JP-A No. 59-5240, JP-A No. 59-5241 and JP-A No. 2-226149, and the amino group-containing compounds described in JP-A No. 1-165613. The ester monomers described above may be used in a mixture.

A monomer containing an acid group may be used. Examples thereof include (meth)acrylic acid, pentaerythritol triacrylate monosuccinate, dipentaerythritol pentaacrylate monosuccinate, pentaerythritol triacrylate monomaleate, dipentaerythritol pentaacrylate monomaleate, pentaerythritol triacrylate monophthalate, dipentaerythritol pentaacrylate monophthalate, pentaerythritol triacrylate mono-tetrahydrophthalate, and dipentaerythritol pentaacrylate mono-tetrahydrophthalate. Among the above, pentaerythritol triacrylate monosuccinate or the like is preferable.

Specific examples of the amide monomer of an aliphatic polyamine compound and an unsaturated carboxylic acid include, for example, methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide. Examples of other preferred amide-based monomers include the cyclohexylene structure-containing compounds described in JP-B No. 54-21726.

Addition-polymerizable urethane-based compounds produced by an addition reaction of isocyanate with a hydroxyl group are also preferred, examples of which include the vinyl urethane compounds described in JP-B No. 48-41708, which contain two or more polymerizable vinyl groups within a molecule thereof and are produced by adding vinyl monomer containing a hydroxyl group in a compound represented by the following formula to a polyisocyanate compound having two or more isocyanate groups within a molecule thereof.

Formula: $CH_2=C(R^{10})COOCH_2CH(R^{11})OH$ (provided that, $R^{10}$ and $R^{11}$ represent H or $CH_3$.)

Moreover, urethane acrylates disclosed in JP-A No. 51-37193 and JP-B No. 2-32293 and JP-B No. 2-16765 and urethane compounds having an ethylene oxide skeleton such as those disclosed in JP-B No. 58-49860, JP-B No. 56-17654, JP-B No. 62-39417, and JP-B No. 62-39418 are preferable. Furthermore, when addition-polymerizable compounds having an amino structure and/or a sulfide structure in a molecule thereof, which are disclosed in JP-A No. 63-277653, JP-A No. 63-260909, and JP-A No. 1-105238, are used, a colored curable composition that is remarkably excellent in photosensitive speed can be obtained.

Other examples include polyfunctional acrylates or methacrylates, such as polyester acrylates and epoxy acrylates obtained by reacting an epoxy resin and (meth)acrylic acid, such as those disclosed in JP-A No. 48-64183 and JP-B No.

49-43191 and JP-B No. 52-30490; specific unsaturated compounds disclosed in JP-B No. 46-43946, JP-B No. 1-40337, and JP-B No. 1-40336, and vinyl phosphonic acid compounds disclosed in JP-A No. 2-25493. Moreover, in a certain case, a structure containing a perfluoroalkyl group disclosed in JP-A No. 61-22048 is suitably used. Furthermore, substances that are described, as photocuring monomers and photocuring oligomers, in Nihon Secchaku Kyoukai-Shi (Journal of the Adhesion Society of Japan) Vol. 20, No. 7, pp. 300-308 (1984) are also usable.

Details of how to use the addition-polymerizable compounds, such as what structure should be used, whether they should be used alone or in combination or what amount should be added, may be arbitrarily determined depending on the performance design of the colored curable composition. For example, they may be selected from the following viewpoints.

In view of sensitivity, the addition-polymerizable compound preferably has a structure having a higher content of the unsaturated groups per molecule, and difunctional or higher functional structures are preferred in many cases. In order to increase the strength of an image portion (a cured film), the addition-polymerizable compound preferably has a tri- or higher-functional structure. A method of using a combination of compounds having different numbers of functional groups and/or different types of polymerizable groups (for example, an acrylic ester, a methacrylic ester, a styrene-based compound, a vinyl ether-based compound) is also effective for regulating both of sensitivity and strength. The use of a compound containing two or more (meth)acrylic ester structures is preferable, use of a compound containing three or more (meth)acrylic ester structures is more preferable, and use of a compound containing four or more (meth)acrylic ester structures is most preferable, from the viewpoint of curing sensitivity. The addition-polymerizable compound preferably contains an EO-modified product from the viewpoint of curing sensitivity and developability of an unexposed portion. The addition-polymerizable compound is preferably a compound containing a urethane bond from the viewpoint of curing sensitivity and strength of an exposed portion.

Selection and usage mode of the addition-polymerizable compound are important factors with respect to the compatibility with other components contained in the colored curable composition (for example, a resin, a photopolymerization initiator, and a pigment) and dispersibility as well. For example, the compatibility may be improved by using a low-purity compound or two or more addition-polymerizable compounds. Furthermore, a specific structure may be selected in order to improve the adhesiveness with a substrate, or the like.

From the above-mentioned viewpoints, preferable examples include bisphenol A diacrylate, a bisphenol A diacrylate EO-modified product, trimethylolpropane triacrylate, trimethylolpropane tri(acryloyloxypropyl) ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, a pentaerythritol tetraacrylate EO-modified product, and a dipentaerythritol hexaacrylate EO-modified product. As commercially available products, urethane oligomers such as UAS-10 and UAB-140 (produced by Sanyo-Kokusaku Pulp Co., Ltd.); DPHA-40H (produced by Nippon Kayaku Co., Ltd.); UA-306H, UA-306T, UA-306I, AH-600, T-600 and AI-600 (produced by Kyoeisha Chemical Co., Ltd.) and UA-7200 (produced by Shin-Nakamura Chemical Co., Ltd.) is preferred.

Among these, a bisphenol A diacrylate EO-modified product, pentaerythritol triacrylate, pentaerythritol tetraacrylate, dipentaerythritol pentaacrylate, dipentaerythritol hexaacrylate, tri(acryloyloxyethyl) isocyanurate, a pentaerythritol tetraacrylate EO-modified product, and a dipentaerythritol hexaacrylate EO-modified product are more preferable, and, as commercially available products, DPHA-40H (produced by Nippon Kayaku Co., Ltd.) and UA-306H, UA-306T, UA-306I, AH-600, T-600 and AI-600 (produced by Kyoeisha Chemical Co., Ltd.) are more preferable.

The content of (D) the compound containing an ethylenically unsaturated double bond of the invention with respect to the solid content of the colored curable composition of the invention is preferably from 1 to 90% by mass, more preferably from 5 to 80% by mass, and further preferably from 10 to 70% by mass.

In the case in which the colored curable composition of the invention is used for forming a colored pattern of a color filter in particular, the content of (D) the compound containing ethylenically unsaturated double bond is preferably in the range of from 5 to 50% by mass, more preferably in the range of from 7 to 40% by mass, and still more preferably in the range of from 10 to 35% by mass, in the range described above. When the composition falls in the range, developability is excellent and pattern shape is good, and thus it is preferred.

The colored curable composition of the invention preferably further contains (F) alkali-soluble resin. Developability and pattern formability is improved by containing the alkali-soluble resin.

(F) Alkali-Soluble Resin

An alkali-soluble resin to be used in the invention is a linear organic high molecular polymer, and may be appropriately selected from alkali-soluble resins having at least one alkali-solubility enhancing group (for example, a carboxyl group, a phosphoric acid group, a sulfonic acid group, and a hydroxyl group) in a molecule thereof (preferably a molecule containing an acrylic copolymer or a styrene-based copolymer as a main chain).

Preferable examples of the alkali-soluble resin include an acrylic copolymer such as a polymer having a carboxylic acid in a side chain, for example, a methacrylic acid copolymer, an acrylic acid copolymer, an itaconic acid copolymer, a crotonic acid copolymer, a maleic acid copolymer, a partially-esterified maleic acid copolymer, an acidic cellulose derivative having a carboxylic acid in a side chain, and a polymer obtained by adding an acid anhydride to a polymer having a hydroxyl group, such as those described in, for example, JP-A No. 59-44615, JP-B No. 54-34327, JP-B No. 58-12577 and JP-B No. 54-25957, JP-A No. 59-53836 and JP-A No. 59-71048.

The acid value of the alkali-soluble resin is preferably in the range of from 20 mgKOH/g to 200 mgKOH/g, more preferably in the range of from 30 mgKOH/g to 150 mgKOH/g, and still more preferably in the range of from 35 mgKOH/g to 120 mgKOH/g.

In particular, with respect to a specific constitutional unit of the alkali-soluble resin, a copolymer of (meth)acrylic acid and another monomer copolymerizable therewith is preferable. Examples of another monomer copolymerizable with (meth)acrylic acid include, for example, alkyl(meth)acrylate, aryl(meth)acrylate, and vinyl compound. Here, hydrogen atoms of an alkyl group and an aryl group may be substituted with a substituent.

The alkyl(meth)acrylate and aryl(meth)acrylate may be represented by $CH_2=C(R^1)(COOR^3)$ (here, $R^1$ represents a hydrogen atom or an alkyl group having 1 to 5 carbon atoms, $R^3$ represents an alkyl group having 1 to 8 carbon atoms or an aralkyl group having 6 to 12 carbon atoms), and specifically include, for example, methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, cyclohexyl(meth)acrylate, hydroxyalkyl(meth)acrylate, (alkyl represents an alkyl group having 1 to 8 carbon atoms), hydroxyglycidyl methacrylate, and tetrahydrofurfuryl methacrylate.

Furthermore, a resin having a polyalkylene oxide chain in a side chain of a molecule is preferred. The polyalkylene oxide chain may be a polyethylene oxide chain, a polypropylene oxide chain, a polytetramethylene glycol chain or a combination of these, and a terminal is a hydrogen atom or a linear or branched alkyl group.

Repeating units of polyethylene oxide chain and polypropylene oxide chain are preferably 1 to 20, and more preferably 2 to 12. Examples of the acrylic copolymers having a polyalkylene oxide chain in a side chain include an acrylic copolymer containing copolymerization components such as 2-hydroxyethyl(meth)acrylate, hydroxypropyl(meth)acrylate, polyethylene glycol mono(meth)acrylate, polypropylene glycol mono(meth)acrylate, and poly(ethylene glycol-propylene glycol)mono(meth)acrylate, and compounds in which terminal OH groups of these compounds are alkyl sealed, for example, methoxypolyethylene glycol mono(meth)acrylate, ethoxypolypropylene glycol mono(meth)acrylate, and methoxypoly(ethylene glycol-propylene glycol)mono(meth)acrylate.

Furthermore, examples of the vinyl compound include $CH_2=CR^2R^4$ [here, $R^2$ represents an aromatic hydrocarbon ring having 6 to 10 carbon atoms, $R^4$ represents a hydrogen atom or an alkyl group having 1 to 5 carbon atoms], and specifically include, for example, styrene, α-methyl styrene, vinyl toluene, acrylonitrile, vinyl acetate, N-vinyl pyrrolidone, polystyrene macromonomer, and polymethyl methacrylate macromonomer.

These other copolymerizable monomers may be used singly or in combination of two or more kinds. Preferable other copolymerizable monomers include alkyl(meth)acrylate (alkyl represents an alkyl group having 2 to 4 carbon atoms), phenyl(meth)acrylate, benzyl(meth)acrylate and styrene.

Among these, in particular, benzyl(meth)acrylate/(meth)acrylic acid copolymer or a multi-component copolymer of benzyl(meth)acrylate/(meth)acrylic acid/other monomers is preferred.

The acid value of these acrylic resins is preferably in the range of from 20 to 200 mgKOH/g as mentioned above. In the case in which the acid value exceeds 200, the solubility of the acrylic resin in an alkali becomes excessively high and a range within which proper development can be performed (development latitude) is narrowed. When the acid value is less than 20, the solubility of the alkali-soluble resin in an alkali is low, and development takes a long time, and thus it is not preferred.

The mass average molecular weight Mw (value in terms of polystyrene measured by GPC) of the acrylic resin is preferably from 2,000 to 100,000, more preferably from 3,000 to 50,000, in order to realize the viscosity range which can be easily used in a color resist coating step or the like as well as to preserve the film strength.

The setting of the acid value of the acrylic resin to the range specified in the above can be easily performed by properly adjusting the copolymerization ratio of each monomer. Furthermore, the setting of the mass average molecular weight to the above range, when monomers are copolymerized, can be easily performed by properly using a chain transfer agent according to a polymerization method.

For example, the acrylic resin can be produced by a known radical polymerization method. The polymerization conditions such as temperature, pressure, kind of radical initiator and amount thereof, or kinds of solvent when the acrylic resin is produced by the radical polymerization method can be easily set by those skilled in the art and conditions can be set.

The amount of the alkali-soluble resin to be added into the colored curable composition of the invention is preferably 5 to 90% by mass, and more preferably 10 to 60% by mass, with respect to the total solid content of the composition. When the alkali-soluble resin is in the above range, film strength is suitably increased, and solubility in development is easily controlled, and therefore it is preferred. It is preferred from the viewpoint that a coating film with desirable thickness is easily obtained. In particular, an excellent coating film can be obtained in a high yield ratio particularly when coated by slit coating, which is suitable for coating on a wide substrate having a large area.

In order to improve crosslinking efficiency of the curable colored composition in the invention, an alkali-soluble resin having a polymerizable double bond may be used singly or in a combination with an alkali-soluble resin not having a polymerizable double bond. A polymer containing an aryl group, a (meth)acryloyl group, or an aryloxyalkyl group as a polymerizable double bond in a side chain is useful.

The alkali-soluble resin having a polymerizable double bond can be developed with an alkali developer and has photo-curing property and thermosetting property.

Examples of these polymers containing a polymerizable double bond are described below, but are not restricted to those described below as long as they contain an alkali-soluble group such as a COOH group or an OH group, and a carbon-carbon unsaturated bond.

(1) A urethane-modified polymerizable double bond-containing acrylic resin, which is obtained by allowing an acrylic resin having a carboxyl group to react with a compound which has at least one (meth)acryloyl group and in which isocyanate groups and OH groups have been previously reacted with each other to leave one unreacted isocyanate group;

(2) a unsaturated group-containing acrylic resin obtained by allowing an acrylic resin containing a carboxyl group to react with a compound having both an epoxy group and a polymerizable double bond in a molecule thereof;

(3) an acid-pendant epoxy acrylate resin; and (4) a polymerizable double bond-containing acrylic resin obtained by allowing an acrylic resin containing an OH group to react with a dibasic acid anhydride having a polymerizable double bond.

Among these, in particular, the resin of (1) or (2) is preferred.

The acid value of the alkali-soluble resin having a polymerizable double bond in the invention is preferably in the range of from 30 mgKOH/g to 150 mgKOH/g, and more preferably in the range of from 35 mgKOH/g to 120 mgKOH/g. Furthermore, mass average molecular weight Mw is preferably from 2,000 to 50,000, and more preferably from 3,000 to 30,000.

A specific example is a compound obtained by allowing a compound having an epoxy ring having reactivity with an OH group and having an unsaturated carbon-carbon bond (for example, glycidyl acrylate), to react with a copolymer of a monomer having an OH group (for example, compounds such as 2-hydroxyethyl acrylate), a monomer having a COOH group (for example, methacrylic acid), and a monomer copolymerizable therewith (such as an acrylic or vinyl compound). Other than the epoxy ring, a compound having an acid anhydride, an isocyanate group, or an acryloyl group is also usable for the reaction with the OH group. Furthermore, a reaction product obtained by allowing a saturated or unsaturated polybasic acid anhydride to react with a compound obtained by reacting an unsaturated carboxylic acid such as acrylic acid with a compound having an epoxy ring, which is described in JP-A No. 6-102669 and JP-A No. 6-1938 may be used.

Examples of a compound having both an alkali-soluble group, such as a COOH group, and an unsaturated carbon-carbon group include DIANAL NR series (produced by Mitsubishi Rayon Co., Ltd.); PHOTOMER 6173 (produced by Diamond Shamrock Co., Ltd, COOH group-containing polyurethane acrylic oligomer); BISCOAT R-264 and KS RESIST 106 (produced by Osaka Organic Chemical Industries, Ltd.); CYCLOMER P series and PRAXEL CF 200 series (produced by Daicel Chemical Industries, Ltd.); and EBECRYL 3800 (produced by Daicel-UCB Co., Ltd.).

The colored curable composition of the invention may contain components described below in detail, if necessary.

<Sensitizer>

The colored curable composition of the invention may include a sensitizer for the purposes of improving the radical generation efficiency of the polymerization initiator and obtaining a longer photosensitive wavelength. The sensitizer to be used in the invention is preferably a sensitizer that sensitizes a photopolymerization initiator described above, by an electron transfer mechanism or an energy transfer mechanism. The sensitizer which can be used in the invention may belong to any of the groups of compounds described below and may have an absorption wavelength in the wavelength region of 300 nm to 450 nm.

The preferable sensitizer may belong to any of the groups of compounds described below and may have an absorption wavelength in the wavelength region of from 330 nm to 450 nm.

Examples include, for example, polynuclear aromatic compounds (for example phenanthrene, anthracene, pyrene, perylene, triphenylene, and 9,10-dialkoxyanthracene), xanthenes (for example fluorescein, eosin, erythrosine, rhodamine B, and rosebengal), thioxanthones (isopropylthioxanthone, diethylthioxanthone and chlorothioxanthone), cyanines (for example thiacarbocyanine and oxacarbocyanine), merocyanines (for example merocyanine and carbomerocyanine), phthalocyanines, thiazines (for example thionine, methylene blue and toluidine blue), acridines (for example acridine orange, chloroflavin and acriflavin), anthraquinones (for example anthraquinone), squaliums (for example squalium), acridine orange, coumarins (for example 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, Spiro compounds, quinacridone, indigo, styryl compounds, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone, and Michler's ketone, and heterocyclic compounds such as N-aryloxazolidinone.

Examples include compounds described in EP No. 568, 993, U.S. Pat. Nos. 4,508,811, 5,227,227, JP-A No. 2001-125255, or JP-A No. 11-271969.

<Polymerization Inhibitor>

In the invention, a small amount of a thermal polymerization inhibitor is preferably added in order to inhibit unnecessary thermal polymerization of the compound containing a polymerizable ethylenically unsaturated double bond during the production or storage of the colored curable composition.

Examples of the thermal polymerization inhibitor that can be used in the invention include, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenyl hydroxylamine cerous salt.

The amount of the polymerization inhibitor to be added is preferably about 0.01% by mass to 5% by mass with respect to the total solid content of the composition.

If necessary, in order to prevent polymerization inhibition due to oxygen, a higher fatty acid derivative such as behenic acid or behenic acid amide may be added and localized to the surface of a photosensitive layer during a drying process after coating. The amount of the higher fatty acid derivative to be added is preferably from about 0.5% by mass to about 10% by mass with respect to the total solid content of the composition.

<Other Additives>

Furthermore, an inorganic filler, a plasticizer, and a substrate adhesive capable of improving adhesion property to a substrate may be added to the colored curable composition of the invention, in order to improve the physical properties of the cured film.

Examples of the plasticizer include, for example, dioctyl phthalate, didodecyl phthalate, triethyleneglycol dicaprylate, dimethylglycol phthalate, tricresyl phosphate, dioctyl adipate, dibutyl sebacate, and triacetyl glycerol. In the case in which an alkali-soluble resin is used, the plasticizer may be added in an amount of 10% by mass or less with respect to the total mass of an ethylenically unsaturated double bond-containing compound and the alkali-soluble resin.

In the case in which the colored curable composition of the invention is applied to a hard surface such as a substrate, an additive (hereinafter, refer to "substrate adhesive") for improving adhesion to the hard surface may be added.

The substrate adhesive may be known materials. It is particularly preferred to use a silane-based coupling agent, a titanate-based coupling agent, and an aluminum-based coupling agent.

Examples of the silane-based coupling agent include, for example, γ-(2-aminoethyl)aminopropyltrimethoxysilane, γ-(2-aminoethyl)aminopropyldimethoxysilane, β-(3,4-epoxycyclohexyl)ethyltrimethoxysilane, y-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatepropyltrimethoxysilane, γ-isocyanatepropyltriethoxysilane, N-β-(N-vinylbenzylaminoethyl)-γ-aminopropyltrimethoxysilane.hydrochloride, γ-glycidoxypropyltrimetoxysilane, γ-glycidoxypropyltriethoxysilane, aminosilane, γ-mercaptopropyltrimethoxysilane, γ-mercaptopropyltriethoxysilane, methyltrimethoxysilane, methyltriethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyl dimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyl dimethoxysilane.

Among the above, γ-methacryloxypropyltrimethoxysilane, γ-methacryloxypropyltriethoxysilane, γ-acryloxypropyltrimethoxysilane, γ-acryloxypropyltriethoxysilane, γ-mercapropropyltrimethoxysilane, γ-aminopropyltriethoxysilane, and phenyltrimethoxysilane are preferable, and γ-methacryloxypropyl trimethoxysilane is most preferable.

Examples of the titanate-based coupling agent include, for example, isopropyl triisostearoyl titanate, isopropyl tridecylbenzenesulfonyl titanate, isopropyl tris(dioctylpyrophosphate)titanate, tetraisopropyl bis(dioctylphosphite)titanate, tetraoctyl bis(ditridecylphosphite)titanate, tetra(2,2-diallyloxymethyl)bis(di-tridecyl)phosphite titanate, bis(dioctylpyrophosphate)oxyacetate titanate, bis(dioctylpyrophosphate)ethylene titanate, isopropyl trioctanoyl titanate, isopropyl dimethacryl isostearoyl titanate, isopropyl isostearoyl diacryl titanate, triisopropyl tri(dioctylphosphate)titanate, isopropyl tricumylphenyl titanate, isopropyl tri(N-amidoethyl, aminoethyl)titanate, dicumylphenyl oxyacetate titanate, and diisostearoyl ethylene titanate.

The aluminum-based coupling agent is, for example, acetoalkoxyaluminum diisopropionate.

The content of substrate adhesive with respect to the total solid content of the colored curable composition of the invention is preferably from 0.1% by mass to 30% by mass, more preferably from 0.5% by mass to 20% by mass, and particularly preferably from 1% by mass to 10% by mass, from the viewpoint of preventing a residue of a colored curable composition from remaining in an unexposed portion.

The colored curable composition of the invention may be cured with high sensitivity and have preferable storage stability. Moreover, the curable composition of the invention shows the high adhesion property to the surface of the hard material such as a substrate to be used. Therefore, the colored curable composition of the invention may be used preferably in the field of the image forming materials such as the three-dimensional photolithography, holography and color filters, or inks, paints, adhesives, and coating agents.

Furthermore, even when the colored curable composition of the invention contains fine pigments at a high concentration, it is excellent in pigment dispersion stability and developability and a colored area having good color characteristic can be formed with high definition. Thus, in the case in which a color filter for the solid-state imaging device is produced, in particular, so as to form a pixel having film thickness of 0.8 μm or less, preferably a range of from 0.1 to 0.5 μm, the effect is particularly noticeable as a result of using the colored curable composition of the invention.

[Color Filter and Production Method Thereof]

Next, the color filter of the invention and a method for producing the same will be explained.

The color filter of the invention has a colored pattern formed using the colored curable composition of the invention on a support.

Below, the color filter of the invention will be described in detail by referring to a method for producing the same (method for producing the color filter of the invention).

The method for producing the color filter of the invention includes steps of forming a colored layer formed from the curable composition by coating the colored curable composition of the invention onto a support; exposing the colored layer through a mask; and developing the exposed colored layer to form colored patterns.

Hereinbelow, each step in the production method of the invention will be explained.

<Colored Layer Forming Step>

In the colored layer forming step, the colored curable composition of the invention is coated onto a support to form a colored layer formed from the curable composition.

The supports which can be used in the invention include, for example, an alkali-less glass, a soda glass, a Pyrex (registered trademark) glass, a quartz glass and those glasses with a transparent conduction film attached thereto which are used in a liquid crystal display device, a photoelectric conversion device substrate used in a solid-state imaging device, for example, a silicon substrate, and a complementary metal oxide film semiconductor (CMOS). On these substrates, a black stripe, which isolates each pixel, is formed in some cases.

If necessary, on these supports, an undercoating layer may be provided for improving adhesion to an upper layer, preventing diffusion of a substance, or flattening a substrate surface.

As the method of coating the colored curable composition of the invention onto a support, various coating methods such as slit coating, inkjet process, spin coating, flow casting coating, coating with a roller, and screen printing may be applied.

The film thickness just after the coating of the colored curable composition is in the range of preferably 0.1 to 10 μm, more preferably 0.2 to 5 μm, and even more preferably 0.2 to 3 μm, from the viewpoints of giving a uniform film thickness for the coated film and easily drying a coating solvent.

Drying (pre-baking) of the colored layer (curable composition layer) coated on a substrate can be carried out in, for example, a hot plate, and an oven, at a temperature from 50 to 140° C. for 10 to 300 seconds.

The coated film thickness of the colored curable composition after being dried (hereinafter, referred to as 'dry film thickness'), in order to be employed as a color filter for an LCD, is in the range of preferably 0.8 to less than 2.8 μm, more preferably from 0.8 to 2.4 μm, and particularly preferably from 1.0 to 2.2 μm, from the viewpoints of suitability for a thin LCD and insuring the color density.

In order to be employed as a color filter for a solid-state imaging device, the thickness is in the range of preferably 0.05 to less than 1.0 μm, more preferably from 0.1 to 0.8 μm, and particularly preferably from 0.2 to 0.7 μm, from the viewpoints of attaining color density and reducing problems where diagonal light is not reaching a light-receiving portion or concentration difference of light between the end and the center of a device becomes significant.

<Exposure Step>

In the exposure step, the colored layer (curable composition layer) formed in the colored layer forming step is exposed through a mask having a predetermined mask pattern.

In the exposure step of the invention, pattern exposure of the coating film can be performed by exposing the film through a predetermined mask pattern and curing only the film portion irradiated with light. As the radiation that can be used at the exposure, ultraviolet such as g-line, h-line or i-line is preferably used. The irradiation amount is preferably from 5 mJ/cm² to 1500 mJ/cm², more preferably from 10 mJ/cm² to 1000 mJ/cm², and most preferably from 10 mJ/cm² to 500 mJ/cm².

In the case in which a color filter of the invention is used in a liquid crystal display device, the irradiation amount is preferably from 5 mJ/cm² to 200 mJ/cm², more preferably from 10 mJ/cm² to 150 mJ/cm², and most preferably from 10 mJ/cm² to 100 mJ/cm² within the above range. Furthermore, in the case in which the color filter of the invention is used in a solid-state imaging device, the irradiation amount is preferably from 30 mJ/cm² to 1500 mJ/cm², more preferably from 50 mJ/cm² to 1000 mJ/cm², and most preferably from 80 mJ/cm² to 500 mJ/cm² within the above range.

<Development Step>

After the exposure step, alkali development treatment (development step) is performed to elute a portion that has not been irradiated with light in the exposure step into an alkali aqueous solution. Thereby, only a portion cured by irradiation with light remains. A pattern film composed of pixels of each color (three colors or four colors or more) may be formed by development with developer. The developer is preferably an organic alkali developer that does not damage, for example, an underlying circuit, but an inorganic alkali developer may be used. The development temperature is usually from 20° C. to 30° C., and the development time may be from 20 sec to 90 sec.

Examples of the alkali agent to be used in the developer include, for example, an organic alkaline compound such as aqueous ammonia, ethylamine, diethylamine, dimethylethanolamine, tetramethylammonium hydroxide, tetraethylammonium hydroxide, choline, pyrrole, piperidine, or 1,8-diazacyclo-[5.4.0]-7-undecene, and an inorganic compound such as sodium hydroxide, potassium hydroxide, sodium hydrogen carbonate, potassium hydrogen carbonate. An alkaline aqueous solution obtained by diluting these alkali agents with pure water to adjust the concentration so as to be within the range of from 0.001% by mass to 10% by mass, preferably from 0.01% by mass to 1% by mass, is preferably used as the developer. In the case in which the alkaline aqueous solution developer is used, rinsing with pure water is usually performed after developing. Then, drying is performed.

The production method of the invention may include, as necessary, a curing step of curing the formed colored pattern by heating (postbaking) and/or by exposing after the colored layer forming step, the exposure step, and the development step were conducted.

Post-baking is heat treatment after development for completing curing, and heat curing treatment at 100° C. to 240° C. is usually performed. In the case in which a substrate is a glass substrate or a silicon substrate, 200° C. to 240° C. is preferable in the above temperature range.

This post-baking treatment can be performed continuously or in a batch manner using a heating means such as a hot plate, a convection oven (hot air circulating dryer), and a high frequency heating machine so that the coated film after development is placed under the above conditions.

A color filter having desired hues can be manufactured by repeating the above-described steps of a colored layer forming step, an exposing step, and a developing step (further, a curing step if necessary) a number of times corresponding to the number of desired hues.

For the use of the colored curable composition of the invention, only the use for pixels for a color filter has been mainly mentioned, but there is no doubt that the colored curable composition is also applicable to a black matrix provided between pixels of a color filter. The black matrix can be formed in the similar manner to the method of manufacturing pixels, by pattern exposure, alkali development, and then post baking for enhancing curing of the film, except that a black pigment such as carbon black or titanium black is added to the colored curable composition of the invention as the coloring pigment.

Since the color filter of the invention is produced by the colored curable composition of the invention, the curable composition in the exposed portion is excellent in adhesion property to a substrate and developability, so that adhesion property of the formed colored pattern and the support substrate is high, and furthermore, a solid-state imaging device with high resolution can be obtained by a pattern with a desirable cross-sectional shape.

Furthermore, the solid-state imaging device of the invention has a color filter of the invention produced by the production method of a color filter of the invention.

A color filter of the invention can be suitably used in liquid crystal display devices and solid-state imaging devices such as CCDs, and is particularly preferably used in CCDs and CMOSs with high resolution such as more than 1,000,000 pixels. The color filter of the invention may be used as, for example, a color filter disposed between a light receiving portion of each of the pixels constituting a CCD device and a micro-lens for collecting light.

EXAMPLES

Hereinbelow, the invention will be described in more detail with reference to Examples, but the invention is not limited by these. Furthermore, "part" is on a mass basis, unless specified otherwise.

Synthesis Example 1

Synthesis of Polyester (i-1)

10 g of n-octanoic acid, 200 g of ε-caprolactone, and 5 g of titanium (IV) tetrabutoxide were mixed and were heated at 160° C. for 8 hours, and then were cooled to room temperature to obtain polyester (i-1).

Synthesis Examples 2 to 10

Polyesters (i-2) to (i-10) were obtained in the similar manner to Synthesis Example 1, except that kinds and the used amount of carboxylic acid, and kinds of lactone in Synthesis Example 1 were changed as in Table 1

TABLE 1

| Synthesis Example | Polyester | Carboxylic acid (g) | Lactone | Number average molecular weight | Weight average molecular weight |
|---|---|---|---|---|---|
| 1 | i-1 | n-octanoic acid (10) | ε-caprolactone | 3000 | 4500 |
| 2 | i-2 | n-octanoic acid (5) | ε-caprolactone | 5000 | 8000 |

TABLE 1-continued

| Synthesis Example | Polyester | Carboxylic acid (g) | Lactone | Number average molecular weight | Weight average molecular weight |
|---|---|---|---|---|---|
| 3 | i-3 | n-octanoic acid (2.5) | ε-caprolactone | 9000 | 15000 |
| 4 | i-4 | palmitic acid (15) | ε-caprolactone | 4000 | 6500 |
| 5 | i-5 | palmitic acid (1) | ε-caprolactone | 25000 | 34000 |
| 6 | i-6 | decanoic acid (10) | ε-caprolactone | 3500 | 5500 |
| 7 | i-7 | 12-hydroxystearic acid (10) | ε-caprolactone | 8000 | 12000 |
| 8 | i-8 | 12-hydroxystearic acid (5) | Mixture of ε-caprolactone/δ-decanolactone (mass ratio 10/1) | 15000 | 21000 |
| 9 | i-9 | ricinoleic acid (7.5) | ε-caprolactone | 10000 | 14000 |
| 10 | i-10 | n-hexanoic acid (5) | ε-caprolactone | 7000 | 12000 |

Synthesis Example 11

Synthesis of Polyester (i-11)

Under nitrogen flow, 100 g of 12-hydroxy stearic acid, 0.1 g of titanium (IV) tetrabutoxide and 300 g of xylene were mixed and were reacted at an external temperature of 160° C. while water produced was distilled off by a Dean-Stark tube. When the number average molecular weight and weight average molecular weight which were measured by GPC were 8,000 and 12,000, heating was stopped to obtain polyester (i-11).

Synthesis Example 12

Synthesis of Polyester (i-12)

Experiment was carried out in the similar manner to Synthesis Example 11, and when the number average molecular weight and weight average molecular weight which were measured by GPC were 18,000 and 23,000, heating was stopped to obtain polyester (i-12).

Synthesis Example 13

Synthesis of Polyester (i-13)

Under nitrogen flow, 307 g of adipic acid, 110 g of neopentyl glycol and 57 g of 1,4-butanediol and 26 g of ethylene glycol were reacted at an external temperature of 160° C. while water produced was distilled off by a Dean-Stark tube. When the number average molecular weight and weight average molecular weight which were measured by GPC were 8,000 and 13,000, reaction was stopped to obtain polyester (i-13).

Synthesis Example 14

Synthesis of Resin (I-1)

10 g of polyethylene imine (SP-006, manufactured by Nippon Shokubai Co., Ltd., number average molecular weight: 600) and 100 g of polyester (i-1) were mixed and were heated at 120° C. for 3 hours. Then, the resultant was left to stand to 65° C., and propylene glycol monomethyl ether acetate was slowly added thereto, to obtain 10% by mass propylene glycol monomethyl ether acetate (hereinafter, refer to PGMEA) solution of resin (I-1).

Synthesis Examples 15 to 31

10% by mass solution of resin (I-2) to (I-18) in PGMEA were obtained in the similar manner to Synthesis Example 14, except that the kinds and amount of polyethylene imine in Synthesis Example 14 were changed to those of amino compounds described in Table 2 and polyester (i-1) was changed to the polyesters described in Table 2.

Furthermore, in Table 2, SP-003 (number average molecular weight 300), SP-012 (number average molecular weight 1,200), SP-018 (number average molecular weight 1,800), SP-200 (number average molecular weight 10,000) were polyethylene imine produced by Nippon Shokubai Co., Ltd. and SP-018 and SP-200 are compound where the number average molecular weight exceeds 1500.

Synthesis Example 32

Synthesis of Resin (I-19)

10 g of polyethylene imine (SP-006, manufactured by Nippon Shokubai Co., Ltd., number average molecular weight: 600) and 100 g of polyester (i-1) were mixed and were heated at 120° C. for 3 hours. Then, the resultant was left to stand to 65° C., and 50 g of propylene glycol monomethyl ether acetate solution containing 3.0 g of succinic anhydride was slowly added thereto and was heated and stirred for 2 hours. The solution was further diluted with PGMEA, to obtain 10% by mass solution.

Synthesis Example 33

Synthesis of Resin (I-20)

A resin (I-20) was obtained in the similar manner to Synthesis Example 32, except that succinic anhydride of Synthesis Example 32 was changed to glutaric anhydride.

Synthesis Example 34

Synthesis of Resin (I-21)

A resin (I-21) was obtained by synthesis in the similar manner to Synthesis Example 32, except that succinic anhydride of Synthesis Example 32 was changed to diketene.

Synthesis Example 35

Synthesis of Resin (1-22)

A resin (1-22) was obtained by synthesis in the similar manner to Synthesis Example 32, except that succinic anhydride of Synthesis Example 32 was changed to butane sultone.

TABLE 2

| Synthesis Example | Resin | Amino compound (g) | Polyester | Acid value (mgKOH/g) | Amine value (mgKOH/g) |
|---|---|---|---|---|---|
| 14 | I-1 | SP-006 (10) | i-1 | 15 | 20 |
| 15 | I-2 | SP-003 (10) | i-1 | 15 | 19 |
| 16 | I-3 | SP-012 (10) | i-1 | 15 | 20 |
| 17 | I-4 | SP-006 (15) | i-2 | 5 | 23 |
| 18 | I-5 | SP-012 (15) | i-3 | 30 | 21 |
| 19 | I-6 | SP-006 (5) | i-4 | 15 | 14 |
| 20 | I-7 | SP-006 (20) | i-5 | 3 | 55 |
| 21 | I-8 | SP-012 (10) | i-6 | 7 | 16 |
| 22 | I-9 | SP-012 (7.5) | i-7 | 10 | 18 |
| 23 | I-10 | SP-006 (4) | i-8 | 4 | 15 |
| 24 | I-11 | SP-012 (10) | i-9 | 15 | 22 |
| 25 | I-12 | SP-006 (10) | i-10 | 14 | 13 |
| 26 | I-13 | SP-006 (15) | i-11 | 30 | 24 |
| 27 | I-14 | SP-012 (20) | i-12 | 20 | 65 |
| 28 | I-15 | SP-006 (10) | i-13 | 25 | 23 |
| 29 (for Comparative Example) | I-16 | SP-018 (10) | i-1 | 14 | 18 |
| 30 (for Comparative Example) | I-17 | SP-200 (10) | i-1 | 15 | 20 |
| 31 (for Comparative Example) | I-18 | Diethylene triamine (10) | i-1 | 17 | 25 |

Example 1

Here, examples of preparing a colored curable composition containing a pigment which is for forming a color filter for liquid crystal display devices will be mentioned and explained.

1-1. Preparation of Pigment Dispersion Liquid

A mixed solution of 40 parts by mass of C.I. pigment Green 36 (secondary particle diameter of 60 nm (dynamic scattering method), 55 nm (average value where 50 secondary particles were observed and calculated by SEM) as the pigment, 200 parts by mass (20 parts by mass in terms of solid content) of resin (I-1) was mixed and dispersed by a bead mill (zirconia beads having a diameter of 0.3 mm) for 3 hours to prepare a pigment dispersion liquid. With respect to the pigment dispersion liquid, the average primary particle diameter of the pigment measured by dynamic light scattering (with the use of Microtrac Nanotrac UPA-EX 150 (produced by Nikkiso Co., Ltd) without further diluting the pigment dispersion liquid) was 25 nm.

1-2. Preparation of Colored Curable Composition (Coating Liquid))

A colored curable composition was prepared by stirring and mixing so as to have the composition ratio below using the pigment dispersion liquid.

| | |
|---|---|
| Aforementioned pigment dispersion liquid | 600 parts |
| Photopolymerization Initiator (2,2'-bis(2-chlorophenyl)-4,4',5,5'-tetraphenyl-1,2'-biimidazole) | 30 parts |
| Pentaerythritol tetraacrylate | 50 parts |
| Alkali-soluble resin (benzyl methacrylate/methacrylic acid/hydroxyethyl methacrylate copolymer, molar ratio: 80/10/10, Mw: 10000) | 5 parts |
| Solvent: propylene glycol monomethyl ether acetate | 900 parts |
| Substrate Adhesive (3-methacryloxypropyl trimethoxysilane) | 1 part |
| Sensitizer (Compound represented by the following chemical formula α) | 15 parts |
| Cosensitizing Agent (2-mercaptobenzoimidazole) | 15 parts |

Chemical formula α

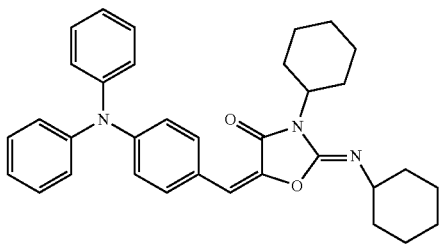 [SMILES: O=C1/C(=C\c2ccc(N(c3ccccc3)c3ccccc3)cc2)O/C(=N\C2CCCCC2)N1C1CCCCC1]

1-3. Formation of Colored Curable Composition Layer

The colored curable composition as a resist liquid is slit-coated on a glass substrate of 550 mm ×650 mm under the conditions below, then left still in that state for 10 minutes, and vacuum dried and pre-baked (100° C. for 80 seconds), to form a colored curable composition coated film (curable composition layer).

(Slit Coating Conditions)

Gap of Opening of Coating head end: 50 μm

Coating Speed: 100 mm/sec

Clearance of Substrate and Coating Head: 150 μm

Dry Film Thickness 1.75 μm

Coating Temperature: 23° C.

1-4. Exposure, Development

Thereafter, the colored curable composition coated film was exposed in a pattern form at 100 mJ/cm$^2$ by LE4000A produced by Hitachi High-Technologies Corporation using a 2.5 kW extra-high pressure mercury lamp with a photo mask for a test having a line width of 20 μm, and after the exposure, a whole face of the coated film was covered with a 1% aqueous solution of inorganic-based developer (trade name: CDK-1, produced by Fuji film electronics material Co., Ltd.) and left for 60 seconds.

1-5. Heating Treatment

After being left, the developer was washed off by showering with pure water, and the coated film subjected to exposure (photocuring) treatment and development treatment was heated in an oven at 220° C. for 1 hour (post baking). Accordingly, a color filter in which the pattern (colored layer) of a colored curable composition was formed on a glass substrate was obtained.

1-6. Performance Evaluation

Storage stability of the colored curable composition prepared in the above manner, contrast of the curable composition coated film (colored layer) formed on a glass substrate by the colored curable composition, developability, and pattern cross-sectional shape, were evaluated in the following manner.

<Dispersibility of Pigment Dispersion Liquid and Storage Stability of Colored Curable Composition>

Viscosity was measured just after dispersing the pigment dispersion liquid and dispersibility was evaluated. The lower the viscosity is, the better the dispersibility is. The colored curable composition was stored at room temperature for 1 month, and then viscosity of the liquid before and after time passing, was measured. Evaluation was made in accordance with the following standard.

—Evaluation Standard—
○: viscosity increase was less than 5%
Δ: viscosity increase of 5% to less than 10% was recognized
×: viscosity increase of 10% or more was recognized <Contrast of Colored Curable Composition Coated Film (Colored Layer))>

The color filter was disposed between two polarizing plates, and the luminance of transmitted light in the case in which the polarization axes of the polarizing plates were parallel and vertical was measured using a color luminance meter (COLOR LUMINANCE METER BM-7, produced by TOPCON CORP.) and the contrast was calculated. A larger value of contrast indicates a better performance as a color filter for a liquid crystal display device.

<Developability (Pattern Cross-Sectional Shape, Substrate Adhesion Property)>

The substrate surface and cross-sectional shape after the post-baking were confirmed by optical microscopy and SEM photography observation, thereby evaluating the pattern cross-sectional shape, and substrate adhesion property as the developability. Details of the evaluation method/evaluation standard are shown as below.

<Substrate Adhesion Property>

For evaluation of the adhesion property to a substrate, whether or not the pattern deficiency was generated was observed. An evaluation standard is shown as below.

—Evaluation Standard—
○: pattern deficiency was not observed at all
Δ: pattern deficiency was partially observed
×: pattern deficiency was notably observed <Pattern Cross-Sectional Shape>

A cross-sectional shape of the pattern formed was observed. The pattern cross-sectional shape is most preferably in a forward tapered shape, or secondly preferably in a rectangular shape. An inverse tapered shape is not preferable.

Examples 2 to 15, Example 35 to 38, Comparative Examples 1 to 3

The pigment dispersion liquid, the colored curable composition and the color filter were manufactured and evaluated in the similar manner to Example 1, except that resin (I-1) and pigment (C.I. pigment green 36) of Example 1 were changed to resins and pigments described in Table 3. The results are shown in Table 3.

Example 16

In preparing the pigment dispersion liquid of Example 1, the pigment dispersion liquid, the colored curable composition and the color filter were manufactured and evaluated in the similar manner to Example 1, except that zirconia beads having a diameter of 0.5 mm was used and mixing and dispersion were performed for 1 hour. The results are shown in Table 3.

Example 17

The pigment dispersion liquid, the colored curable composition and the color filter were manufactured and evaluated in the similar manner to Example 16, except that the alkali-soluble resin of Example 1 is not added. The results are shown in Table 3.

Furthermore, the pigments used in Table 3 and Table 4 below are as follows

PG36: C.I. pigment green 36
PR254: C.I. pigment red 254
PY139: C.I. pigment yellow 139
PY138: C.I. pigment yellow 138
PB15:6: C.I. pigment blue 15:6

Furthermore, Examples 6 and 7 are such that PR254 and PY139 were mixed and used.

TABLE 3

|  | Resin | Pigment | Average primary particle diameter of pigment dispersion liquid (nm) | Initial viscosity of pigment dispersion liquid (mPa·s) | Storage stability | Contrast | Substrate adhesion property | Pattern cross-section shape |
| --- | --- | --- | --- | --- | --- | --- | --- | --- |
| Example 1 | I-1 | PG36 | 25 | 11 | ○ | 20000 | ○ | forward tapered |
| Example 2 | I-2 | PG36 | 30 | 23 | ○ | 15000 | ○ | forward tapered |
| Example 3 | I-3 | PG36 | 25 | 12 | ○ | 14000 | ○ | forward tapered |
| Example 4 | I-4 | PR254 | 25 | 13 | ○ | 19000 | ○ | forward tapered |
| Example 5 | I-5 | PR254 | 25 | 12 | ○ | 16000 | ○ | forward tapered |
| Example 6 | I-6 | PR254/PY139 (mass ratio 8/2) | 25 | 11 | ○ | 20000 | ○ | forward tapered |
| Example 7 | I-7 | PR254/PY139 (mass ratio 8/2) | 25 | 12 | ○ | 19000 | ○ | forward tapered |
| Example 8 | I-8 | PY138 | 25 | 12 | ○ | 16000 | ○ | forward tapered |
| Example 9 | I-9 | PY138 | 25 | 13 | ○ | 15000 | ○ | forward tapered |
| Example 10 | I-10 | PY138 | 25 | 12 | ○ | 19000 | ○ | forward tapered |
| Example 11 | I-11 | PB15:6 | 25 | 12 | ○ | 14000 | ○ | forward tapered |
| Example 12 | I-12 | PB15:6 | 25 | 12 | ○ | 20000 | ○ | forward tapered |
| Example 13 | I-13 | PB15:6 | 25 | 13 | ○ | 19000 | ○ | forward tapered |
| Example 14 | I-14 | PB15:6 | 25 | 12 | ○ | 15000 | ○ | forward tapered |
| Example 15 | I-15 | PB15:6 | 25 | 12 | ○ | 20000 | ○ | forward tapered |
| Example 16 | I-1 | PB15:6 | 42 | 12 | ○ | 16000 | ○ | forward tapered |
| Example 17 | I-1 | PB15:6 | 30 | 11 | ○ | 19000 | ○ | forward tapered |
| Example 35 | I-19 | PG36 | 25 | 7 | ○ | 23000 | ○ | forward tapered |
| Example 36 | I-20 | PG36 | 25 | 8 | ○ | 23000 | ○ | forward tapered |
| Example 37 | I-21 | PG36 | 25 | 9 | ○ | 22000 | ○ | forward tapered |
| Example 38 | I-22 | PG36 | 25 | 9 | ○ | 22000 | ○ | forward tapered |
| Comparative Example 1 | I-16 | PG36 | 30 | 42 | × | 10900 | × | rectangular |
| Comparative Example 2 | I-17 | PG36 | 30 | 51 | × | 9500 | × | inverse tapered |

TABLE 3-continued

| | Resin | Pigment | Average primary particle diameter of pigment dispersion liquid (nm) | Initial viscosity of pigment dispersion liquid (mPa · s) | Storage stability | Contrast | Substrate adhesion property | Pattern cross-section shape |
|---|---|---|---|---|---|---|---|---|
| Comparative Example 3 | I-18 | PG36 | 30 | 69 | X | 10000 | X | rectangular |

From the results in Table 3, the pigment dispersion liquids of Examples 1 to 17 and Examples 35 to 38 containing the resin of the invention were good in dispersibility. In addition, it has been shown that the colored curable compositions using these pigment dispersion liquids are excellent in storage stability. Furthermore, it has been shown that in the case in which colored patterns were formed on a support using the colored curable composition of the invention, a color filter exhibiting high contrast, as well as the excellent substrate adhesion property and pattern cross-sectional shape, can be obtained compared to each Comparative Example not using the resin of the invention.

Example 18

Hereinbelow, examples of preparing a colored curable composition for forming a color filter for solid-state imaging devices will be mentioned and explained.

2-1. Preparation of Resist Liquid

Following components of composition were mixed and dissolved to prepare a resist liquid.

<Composition of Resist Liquid>

| | |
|---|---|
| Solvent: propylene glycol monomethyl ether acetate | 19.20 parts |
| Solvent: ethyl lactate | 36.67 parts |
| Alkali-soluble resin: 40% PGMEA solution of benzyl methacrylate/methacrylic acid/2-hydroxyethyl methacrylate copolymer (molar ratio = 60/22/18, weight average molecular weight 15,000, number average molecular weight 9,000) | 30.51 parts |
| Ethylenically unsaturated double bond-containing Compound: dipentaerythritol hexaacrylate | 12.20 parts |
| Polymerization Inhibitor: p-methoxyphenol | 0.0061 parts |
| Fluorine Surfactant (F-475, produced by Dainippon Ink & Chemicals, Inc.) | 0.83 parts |
| Photopolymerization Initiator: trihalomethyl triazine-based photopolymerization initiator (TAZ-107, produced by Midori Kagaku Co., Ltd.) | 0.586 parts |

2-2. Preparation of Silicon Substrate with Undercoat Layer

A 6-inch silicon wafer was heated in an oven at 200° C. for 30 minutes. Next, the resist liquid was coated on this silicon wafer to have a dry film thickness of 1.5 μm, which was then dried by further heating in an oven at 220° C. for 1 hour to form an undercoat layer, whereby a silicon wafer substrate provided with an undercoat layer was obtained.

2-3. Preparation of Pigment Dispersion Liquid

A mixed solution of 40 parts by mass of a 70/30 (mass ratio) mixture of C.I. pigment Green 36 and C.I. pigment yellow 139 (secondary particle diameter of 65 nm (dynamic scattering method), 55 nm (average value where 50 secondary particles were observed and calculated by SEM)) as the pigment, and 160 parts by mass (16 parts by mass in terms of solid content) of resin (I-1) was blended/dispersed for 3 hours using a bead mill (zirconia beads having diameter of 0.3 mm) to prepare a pigment dispersion liquid.

With respect to the pigment dispersion liquid, the average primary particle diameter of the pigment measured by dynamic light scattering method in a similar manner to Example 1 was 30 nm.

2-4. Preparation of Colored Curable Composition (Coating Liquid)

The colored curable composition was prepared by mixing and stirring the following composition using the pigment dispersion liquid.

| | |
|---|---|
| Aforementioned Pigment dispersion liquid | 600 parts |
| Photopolymerization Initiator (oxime-based photopolymerization initiator) (CGI-124, produced by Ciba Specialty Chemicals) | 30 parts |
| Compound containing ethylenically unsaturated double bond, TO-1382 (produced by TOAGOSEI Co., Ltd.) (Reaction product of mixture of dipentaerythritol hexaacrylate and dipentaerythritol pentaacrylate with anhydrous succinic acid) | 25 parts |
| Compound containing ethylenically unsaturated double bond: dipentaerythritol hexaacrylate | 30 parts |
| Solvent: propylene glycol monomethyl ether acetate | 900 parts |
| Substrate adhesive: 3-methacryloxypropyl trimethoxysilane | 1 part |

2-5. Preparation and Evaluation of Color Filter from Colored Curable Composition <Pattern Formation>

The colored curable composition prepared in the above manner was coated onto the undercoat layer of the silicon wafer provided with an undercoat layer which was obtained in 2-1, to form a colored layer (coated film). The coated film was heated (pre-baking) at 100° C. using a hot plate for 120 seconds to have a dried film thickness of the coated film of 0.5 µm.

Then, the coated film was exposed to a 365 nm-wavelength light through a pattern mask with a 2 µm square island pattern at various exposure doses of 50 to 1200 mJ/cm$^2$ by an i-ray stepper exposure apparatus FPA-3000i5+ (produced by Canon Inc.).

Thereafter, the silicon wafer substrate with the irradiated coated film formed was placed on a horizontal turntable of a spin shower developer (DW-30, produced by Chemitronics Co., Ltd.), and was paddle-developed at 23° C., for 60 seconds by using CD-2000 (produced by Fuji film electronics material Co., Ltd.), to form a colored pattern on the silicon wafer substrate.

The silicon wafer having the colored pattern formed thereon was fixed to the horizontal turntable by vacuum chuck. While the silicon wafer substrate was rotated at 50 r.p.m. by a rotating apparatus, the substrate was rinsed by showering with pure water from a showering nozzle from above the rotation center. The silicon wafer substrate was then spray-dried.

The size of the colored pattern was measured by using a length measuring SEM 'S-9260A' (produced by Hitachi High-Technologies Corporation). The exposure dose providing a pattern size of 2 µm was evaluated as the exposure sensitivity.

<Substrate Adhesion Property>

For evaluation of the adhesion property to a substrate, whether or not the pattern deficiency was generated was observed. Evaluation is made based on the following standard with respect to evaluation items.

—Evaluation Standard—
○: pattern deficiency was not observed at all
Δ: pattern deficiency was partially observed
×: pattern deficiency was notably observed <Pattern Formability>

A cross-sectional shape of the pattern formed was observed. The pattern cross-sectional shape is most preferably in a rectangular shape. An inverse tapered shape is not preferable.

<Dispersibility of Pigment Dispersion Liquid and Storage Stability of Colored Curable Composition>

Viscosity was measured just after dispersing the pigment dispersion liquid and dispersibility was evaluated. The lower the viscosity is, the better the dispersibility is.

The colored curable composition (coating liquid) was stored at room temperature for 1 month, and then viscosity of the liquid before and after time passing was measured. Evaluation was made in accordance with the following standard.

—Evaluation Standard—
○: viscosity increase was less than 5%
Δ: viscosity increase of 5% to less than 10% was recognized
×: viscosity increase of 10% or more was recognized <Color Unevenness>

For evaluating the color unevenness, the luminance distribution was analyzed by the following method, and the proportion of pixels of within ±5% difference from the average in the total number of pixels was determined. The evaluation standard is shown as below.

The method of measuring luminance distribution will be described. The colored curable composition was coated onto the undercoat layer of the glass plate provided with an undercoat layer manufactured in a similar manner to 2-2, to form a colored layer (coated film).

The coated film was heated at 100° C. using a hot plate for 120 seconds (pre-baking) to have a dried film thickness of 0.7 µm. The illumination distribution of the coated glass substrate was analyzed based on images taken with a microscope MX-50 (produced by Olympus Corporation).

—Evaluation Standard—
○: pixels within ±5% difference from the average are 99% or more of the number of total pixels
Δ: pixels within ±5% difference from the average are 95 to less than 99% of the number of total pixels
×: pixels within ±5% difference from the average are less than 95% of the number of total pixels Examples 19 to 32, Example 39 to 42, Comparative Examples 4 to 6

The color filter was manufactured in the similar manner to Example 18 and evaluation was made, except that resin (I-1) and kinds of pigment in Example 18 was changed to those described in Table 4. The results are shown in Table 4.

Example 33

In preparing the pigment dispersion liquid of Example 18, the pigment dispersion liquid, the colored curable composition and the color filter were manufactured and evaluated in the similar manner to Example 18, except that zirconia beads having a diameter of 0.5 mm were used and mixing and dispersion were performed for 1 hour. The results are shown in Table 4.

Example 34

The pigment dispersion liquid, the colored curable composition and the color filter was manufactured in the similar manner to Example 18 and evaluation was made, except that the alkali-soluble resin of Example 18 was not added. The results are shown in Table 4.

TABLE 4

| | Resin | Pigment | Average primary particle diameter of pigment dispersion liquid (nm) | Initial viscosity of pigment dispersion liquid (mPa · s) | Adhesion property to substrate | Pattern formability | Storage stability | Color unevenness |
|---|---|---|---|---|---|---|---|---|
| Example 18 | I-1 | PG36/PY139 (mass ratio 7/3) | 30 | 12 | ○ | rectangular | ○ | ○ |
| Example 19 | I-2 | PG36/PY139 (mass ratio 7/3) | 30 | 26 | ○ | rectangular | ○ | ○ |
| Example 20 | I-3 | PG36/PY139 (mass ratio 7/3) | 30 | 11 | ○ | rectangular | ○ | ○ |
| Example 21 | I-4 | PR254 | 30 | 11 | ○ | rectangular | ○ | ○ |
| Example 22 | I-5 | PR254 | 30 | 12 | ○ | rectangular | ○ | ○ |
| Example 23 | I-6 | PR254/PY139 (mass ratio 8/2) | 30 | 10 | ○ | rectangular | ○ | ○ |

TABLE 4-continued

|  | Resin | Pigment | Average primary particle diameter of pigment dispersion liquid (nm) | Initial viscosity of pigment dispersion liquid (mPa·s) | Adhesion property to substrate | Pattern formability | Storage stability | Color unevenness |
|---|---|---|---|---|---|---|---|---|
| Example 24 | I-7 | PR254/PY139 (mass ratio 8/2) | 30 | 11 | ○ | rectangular | ○ | ○ |
| Example 25 | I-8 | PY138 | 30 | 12 | ○ | rectangular | ○ | ○ |
| Example 26 | I-9 | PY138 | 30 | 11 | ○ | rectangular | ○ | ○ |
| Example 27 | I-10 | PY138 | 30 | 10 | ○ | rectangular | ○ | ○ |
| Example 28 | I-11 | PB15:6 | 30 | 10 | ○ | rectangular | ○ | ○ |
| Example 29 | I-12 | PB15:6 | 30 | 9 | ○ | rectangular | ○ | ○ |
| Example 30 | I-13 | PB15:6 | 30 | 10 | ○ | rectangular | ○ | ○ |
| Example 31 | I-14 | PB15:6 | 30 | 11 | ○ | rectangular | ○ | ○ |
| Example 32 | I-15 | PB15:6 | 30 | 9 | ○ | rectangular | ○ | ○ |
| Example 33 | I-1 | PG36/PY150 (mass ratio 7/3) | 42 | 13 | ○ | rectangular | ○ | Δ |
| Example 34 | I-15 | PG36/PY150 (mass ratio 7/3) | 30 | 11 | ○ | rectangular | ○ | ○ |
| Example 39 | I-19 | PG36 | 30 | 5 | ○ | rectangular | ○ | ○ |
| Example 40 | I-20 | PG36 | 30 | 6 | ○ | rectangular | ○ | ○ |
| Example 41 | I-21 | PG36 | 30 | 7 | ○ | rectangular | ○ | ○ |
| Example 42 | I-22 | PG36 | 30 | 8 | ○ | rectangular | ○ | ○ |
| Comparative Example 4 | I-16 | PG36 | 30 | 38 | X | inverse tapered | X | X |
| Comparative Example 5 | I-17 | PG36 | 30 | 62 | X | inverse tapered | X | X |
| Comparative Example 6 | I-18 | PG36 | 30 | 65 | X | inverse tapered | X | X |

From the results of Table 4, it has been shown that the colored curable compositions of Examples of the invention used for forming color filters for solid-state imaging devices had excellent storage stability. In addition, it has been found that in the case in which a colored pattern was formed on a support using the colored curable composition, color filters having superior developability, excellent pattern formability and color unevenness compared to the Comparative Examples were obtained.

From these results, it has been found that the colored curable compositions of the Examples have excellent pattern formability, in a similar manner to the case of manufacturing a color filter for a liquid crystal display device, even in the case of manufacturing a color filter for a solid-state imaging device.

The invention claimed is:

1. A colored curable composition comprising:
   (A) a resin obtained by reacting (A-1) a polymer of an alkylene imine having 2 to 4 carbon atoms, a number average molecular weight of the polymer being 300 to 1,500, with (A-2) a polyester having a carboxyl group at at least one terminal, a number average molecular weight of the polyester being 1,000 to 1,000,000;
   (B) a pigment;
   (C) a photopolymerization initiator;
   (D) a compound containing an ethylenically, unsaturated double bond; and
   (E) a solvent.

2. The colored curable composition according to claim 1, further comprising (F) an alkali-soluble resin.

3. The colored curable composition according to claim 1, wherein an average primary particle diameter of the pigment is 50 nm or less.

4. A color filter comprising a colored pattern formed by the colored curable composition according to claim 1 on a support, wherein the color filter is used in color separation in a solid-state imaging device.

5. A method for producing a color filter, comprising:
   coating the colored curable composition according to claim 1 on a support to form a colored layer;
   pattern exposing the colored layer through a mask; and
   developing the colored layer after exposure to form a colored pattern.

6. The colored curable composition according to claim 1, wherein (A-2) the polyester is obtained by (i) polycondensation of a carboxylic acid and at least one lactone selected from the group consisting of β-propiolactone, γ-butyrolactone, δ-valerolactone, and ε-caprolactone, (ii) polycondensation of a linear hydroxy group-containing carboxylic acid having 1 to 30 carbon atoms, or (iii) polycondensation of a linear aliphatic diol and a linear divalent aliphatic carboxylic acid or a cyclic acid anhydride thereof.

7. The colored curable composition according to claim 1, wherein the number average molecular weight of the polymer is 500 to 1,200.

8. The colored curable composition according to claim 1, wherein (C) the photopolymerization initiator includes a triazine compound or an oxime compound.

9. The colored curable composition according to claim 1, wherein (C) the photopolymerization initiator includes an oxime compound.

* * * * *